United States Patent
Tada et al.

(10) Patent No.: US 10,665,576 B2
(45) Date of Patent: May 26, 2020

(54) OPTICALLY TRANSPARENT PLATE WITH LIGHT EMITTING FUNCTION AND METHOD OF PRODUCING THE SAME

(71) Applicant: STANLEY ELECTRIC CO., LTD., Meguro-ku, Tokyo (JP)

(72) Inventors: Reiki Tada, Tokyo (JP); Akihiko Hanya, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/007,470

(22) Filed: Jun. 13, 2018

(65) Prior Publication Data

US 2018/0374834 A1     Dec. 27, 2018

(30) Foreign Application Priority Data

Jun. 21, 2017  (JP) ................................ 2017-121607
May 17, 2018  (JP) ................................ 2018-095496

(51) Int. Cl.

| | |
|---|---|
| H01L 33/58 | (2010.01) |
| H01L 25/13 | (2006.01) |
| H01L 33/62 | (2010.01) |
| H01L 33/60 | (2010.01) |
| H01L 33/40 | (2010.01) |
| H01L 25/075 | (2006.01) |

(52) U.S. Cl.
CPC ............ *H01L 25/13* (2013.01); *H01L 33/405* (2013.01); *H01L 33/60* (2013.01); *H01L 33/62* (2013.01); *H01L 25/0753* (2013.01); *H01L 25/0756* (2013.01)

(58) Field of Classification Search
None
See application file for complete search history.

(56) References Cited

U.S. PATENT DOCUMENTS

| | | | | |
|---|---|---|---|---|
| 2008/0074029 | A1* | 3/2008 | Suehiro | H01L 33/501 313/487 |
| 2012/0326175 | A1* | 12/2012 | Hu | H01L 33/46 257/88 |
| 2015/0380616 | A1* | 12/2015 | Chen | H01L 25/0753 257/88 |
| 2017/0263833 | A1* | 9/2017 | Chiu | H01L 33/58 |
| 2018/0077805 | A1 | 3/2018 | Hanya | |

FOREIGN PATENT DOCUMENTS

| | | |
|---|---|---|
| JP | 2008217215 A | 9/2008 |
| JP | 2008234595 A | 10/2008 |
| JP | 2016184621 A | 10/2016 |

\* cited by examiner

*Primary Examiner* — Ali Naraghi
(74) *Attorney, Agent, or Firm* — Holtz, Holtz & Volek PC

(57) ABSTRACT

Provided is an optically transparent plate having a structure where an LED die is directly mounted on an optically transparent substrate, and light extraction efficiency is improved. The optically transparent plate comprises, an optically transparent substrate, a wiring pattern placed on either of a surface on the upper side and a surface on the underside of the optically transparent substrate, or on both of the surfaces, and the LED die bonded to the wiring pattern. A reflective layer is placed on the other side, of the surface of the optically transparent substrate on which the LED die is mounted. At least a part of the wiring pattern and at least a part of the reflective layer comprise a conductive material obtained by sintering conductive particles.

20 Claims, 28 Drawing Sheets

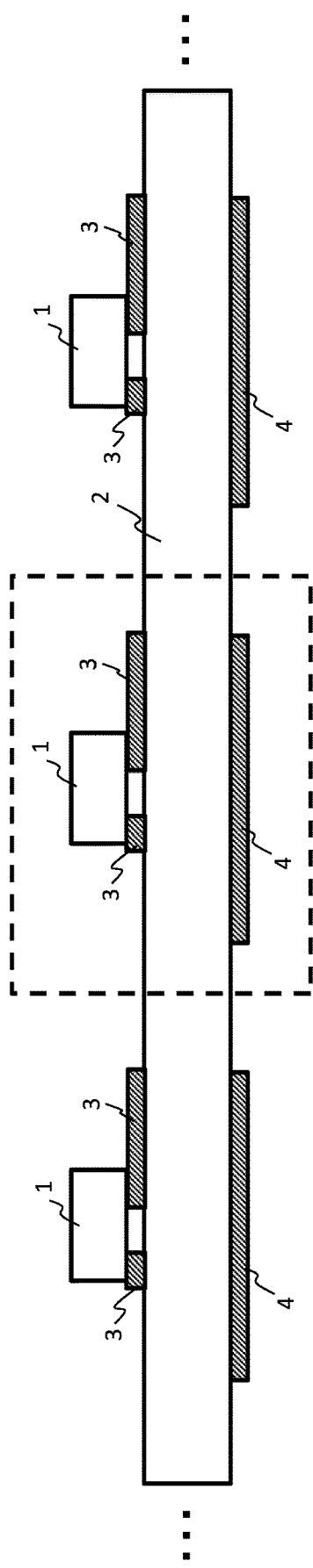

TOP VIEW

CROSS-SECTIONAL VIEW

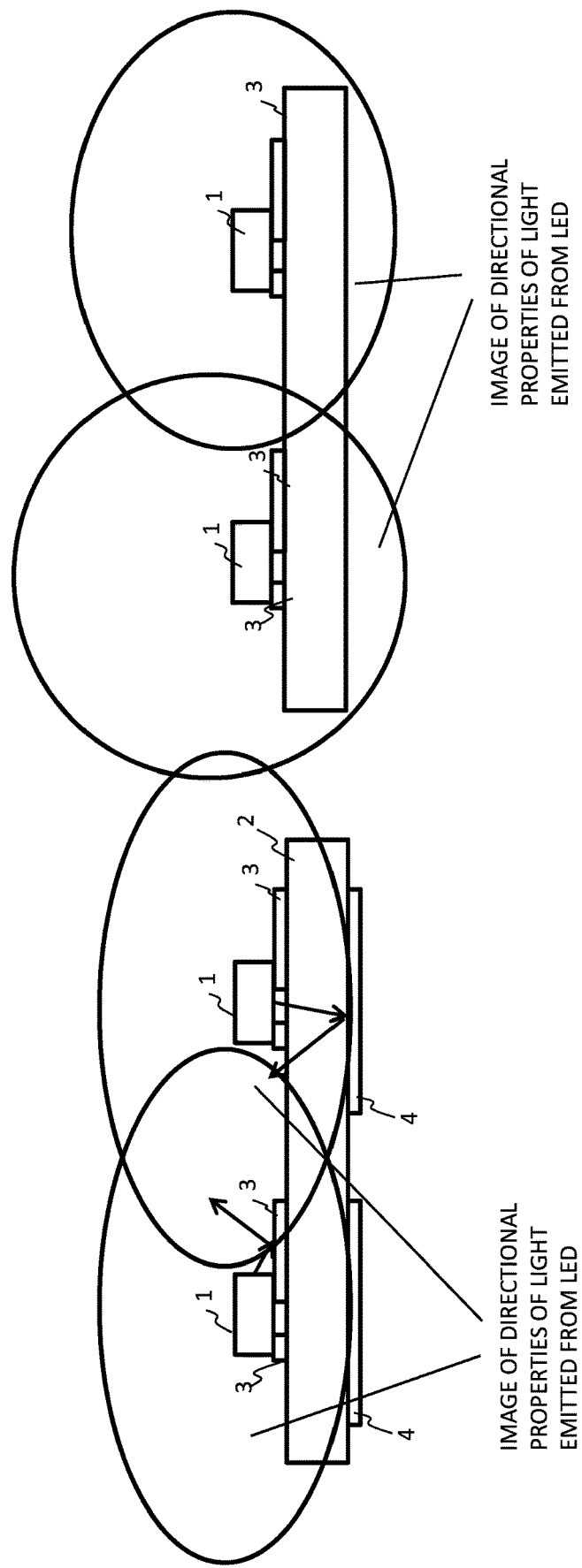

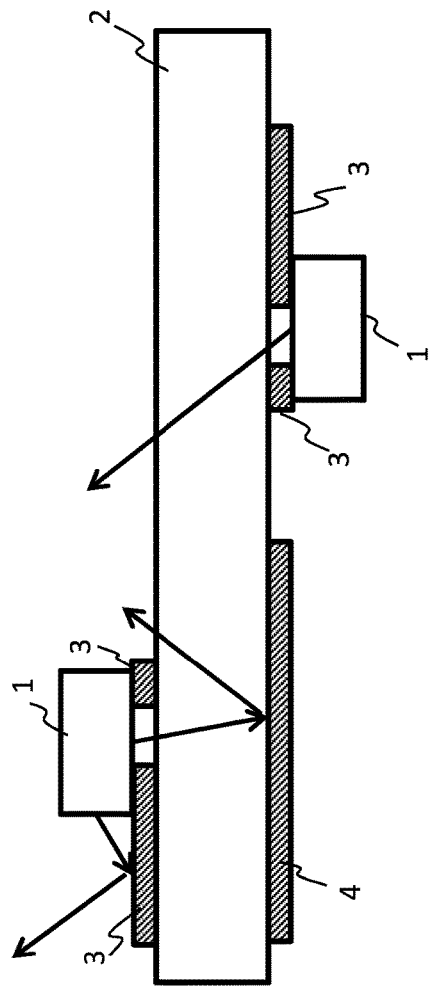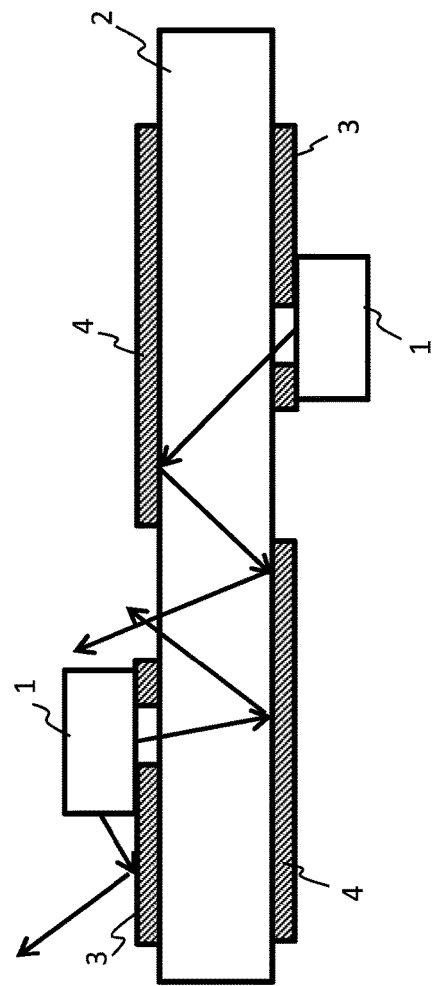

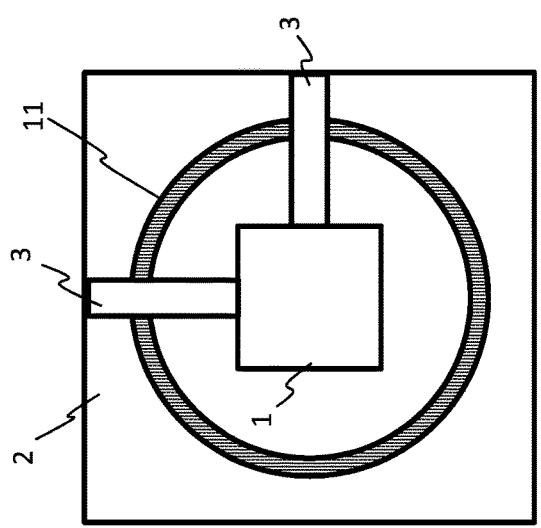
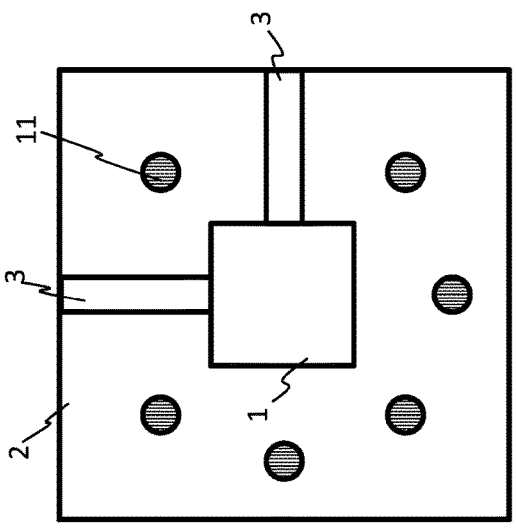
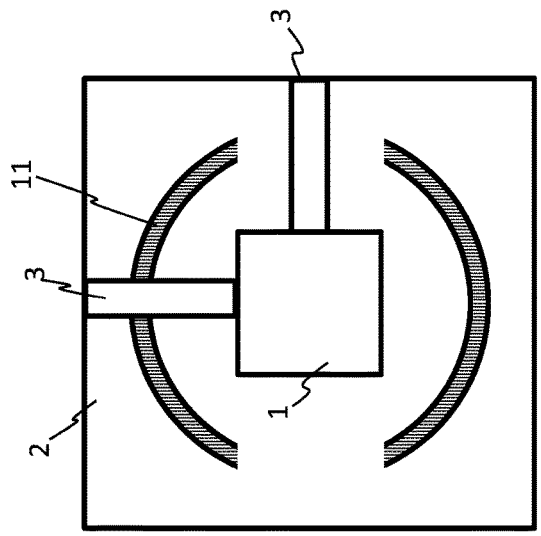
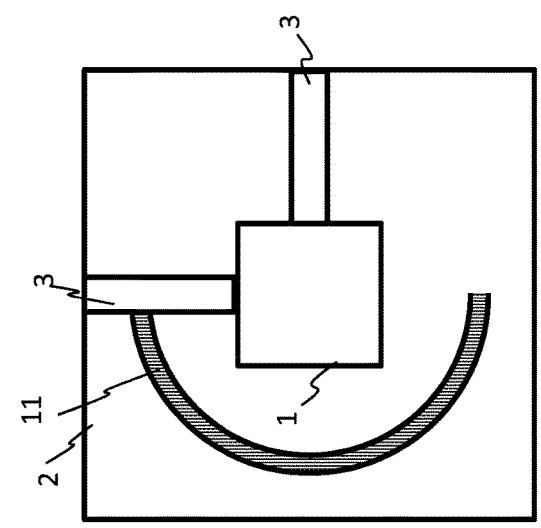
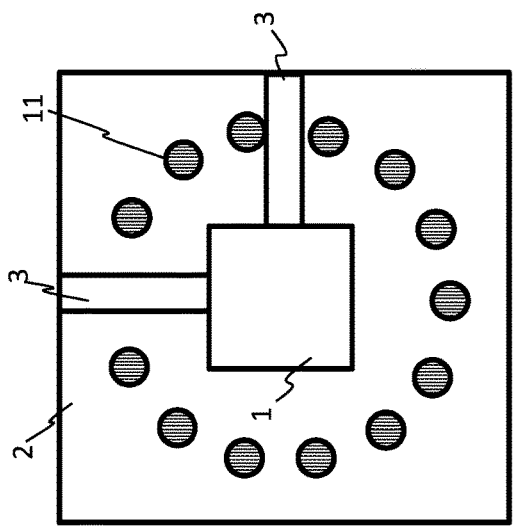

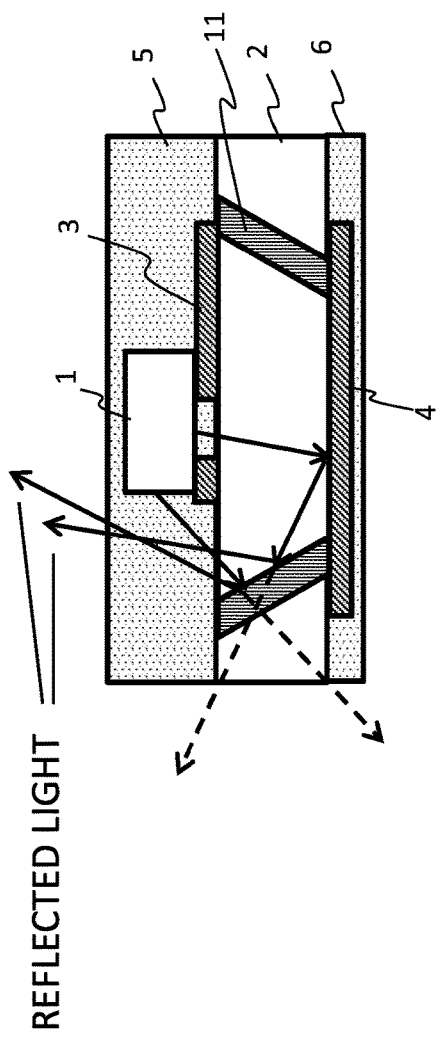
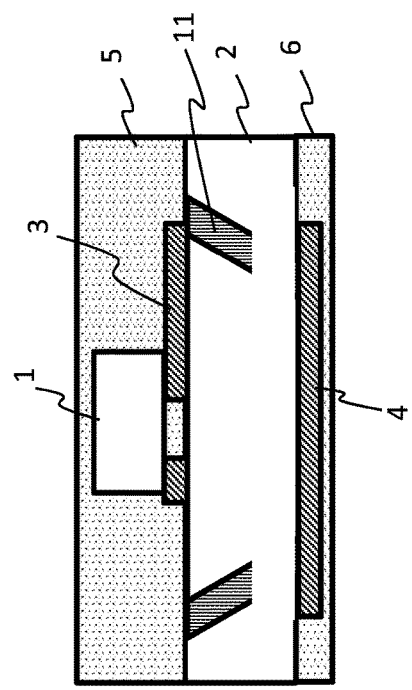

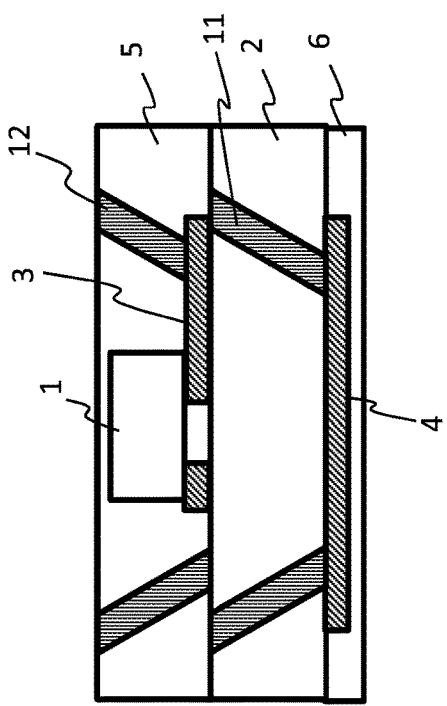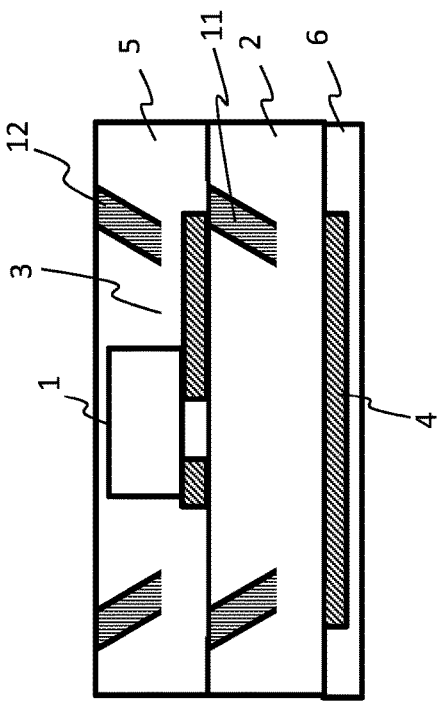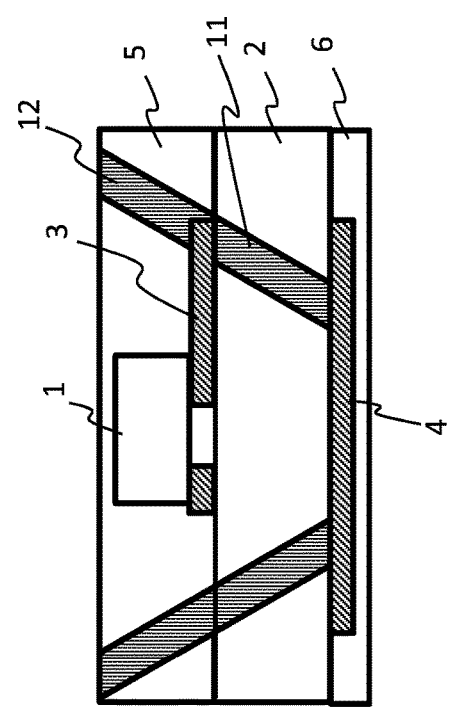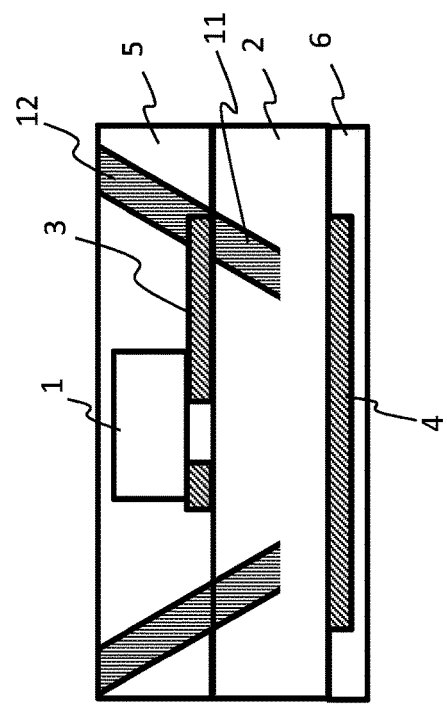

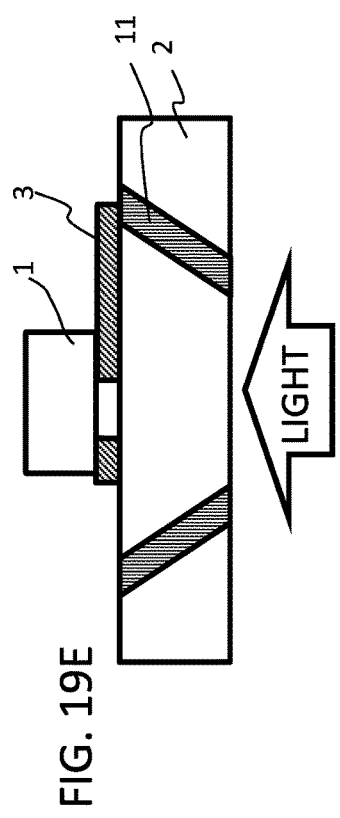
FIG. 19A
FIG. 19B
FIG. 19C
FIG. 19D
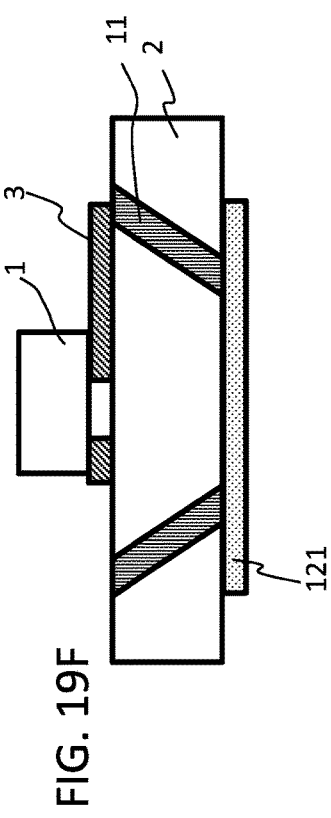
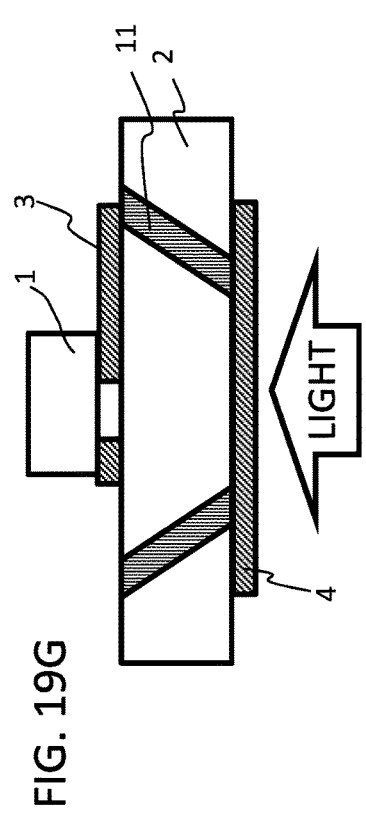
FIG. 19E
FIG. 19F
FIG. 19G

COMPARATIVE EXAMPLE

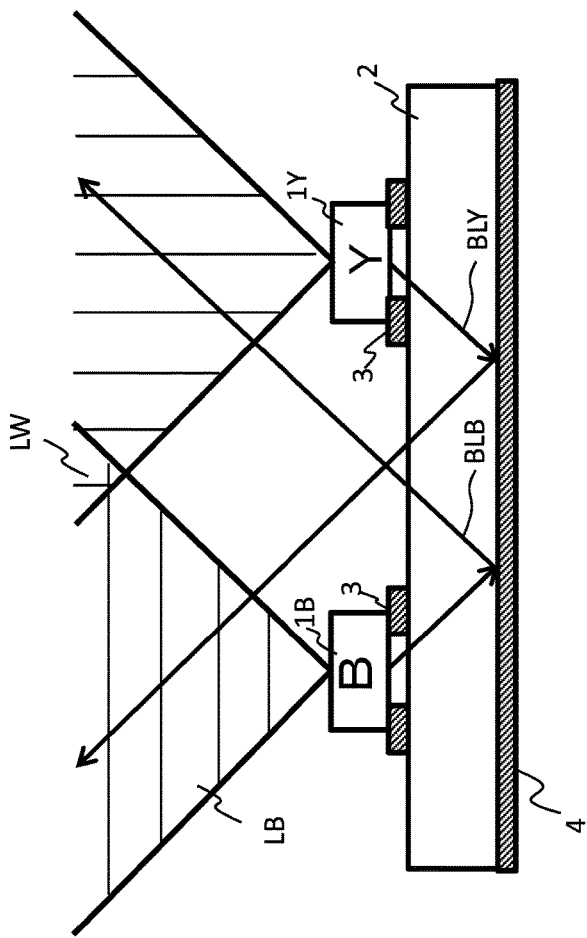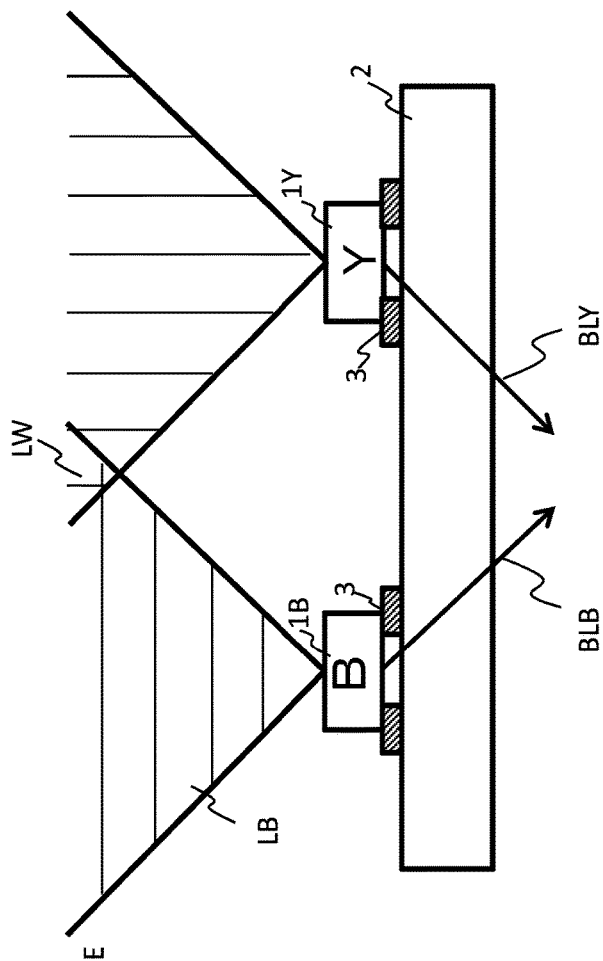
FIG. 22A
FIG. 22B
COMPARATIVE EXAMPLE

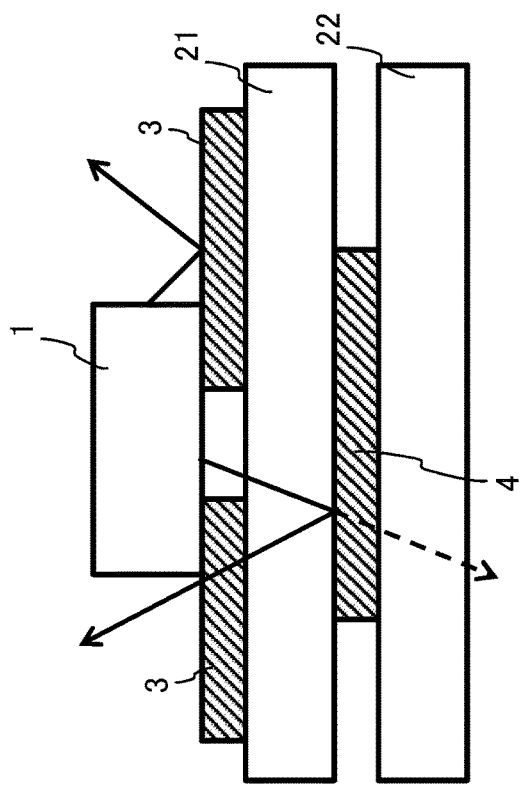
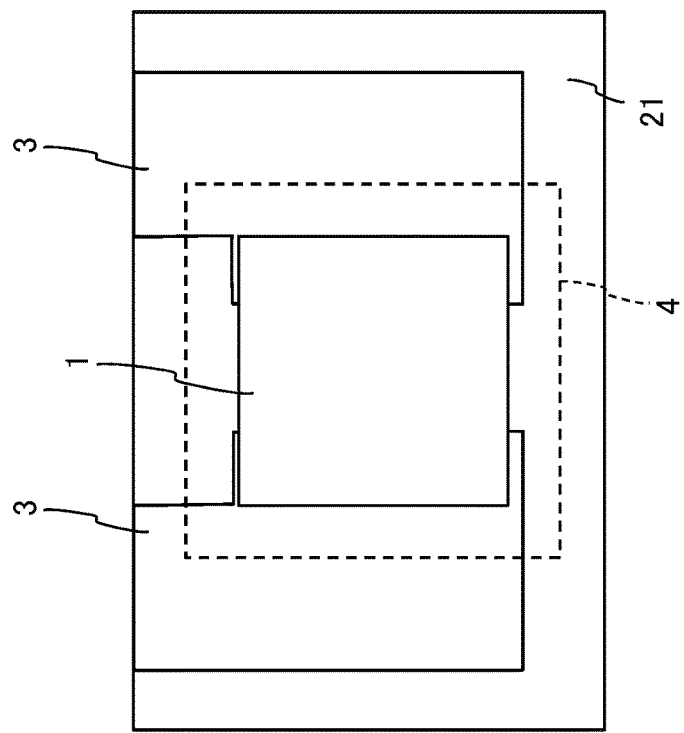
FIG. 24A
FIG. 24B

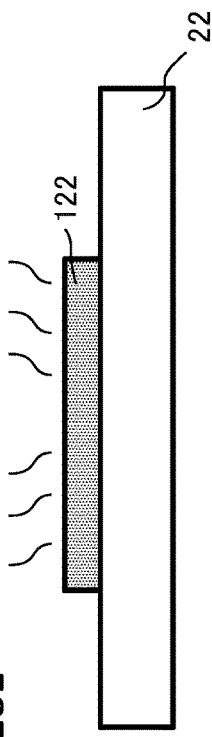
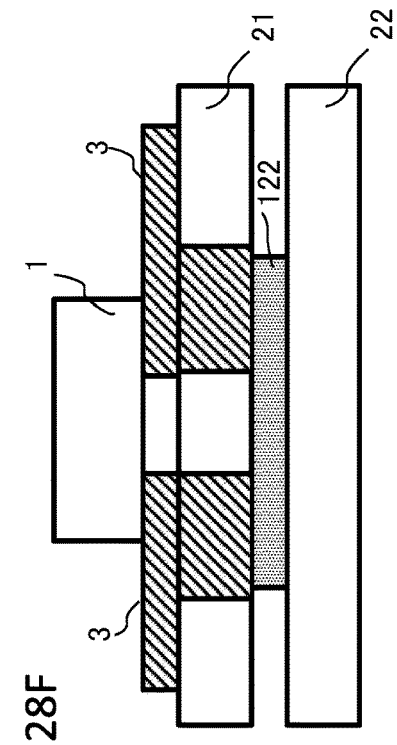
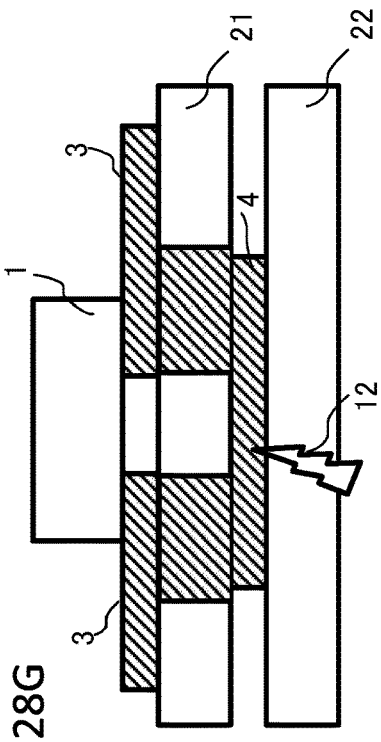
FIG. 28A
FIG. 28B
FIG. 28C
FIG. 28D
FIG. 28E
FIG. 28F
FIG. 28G

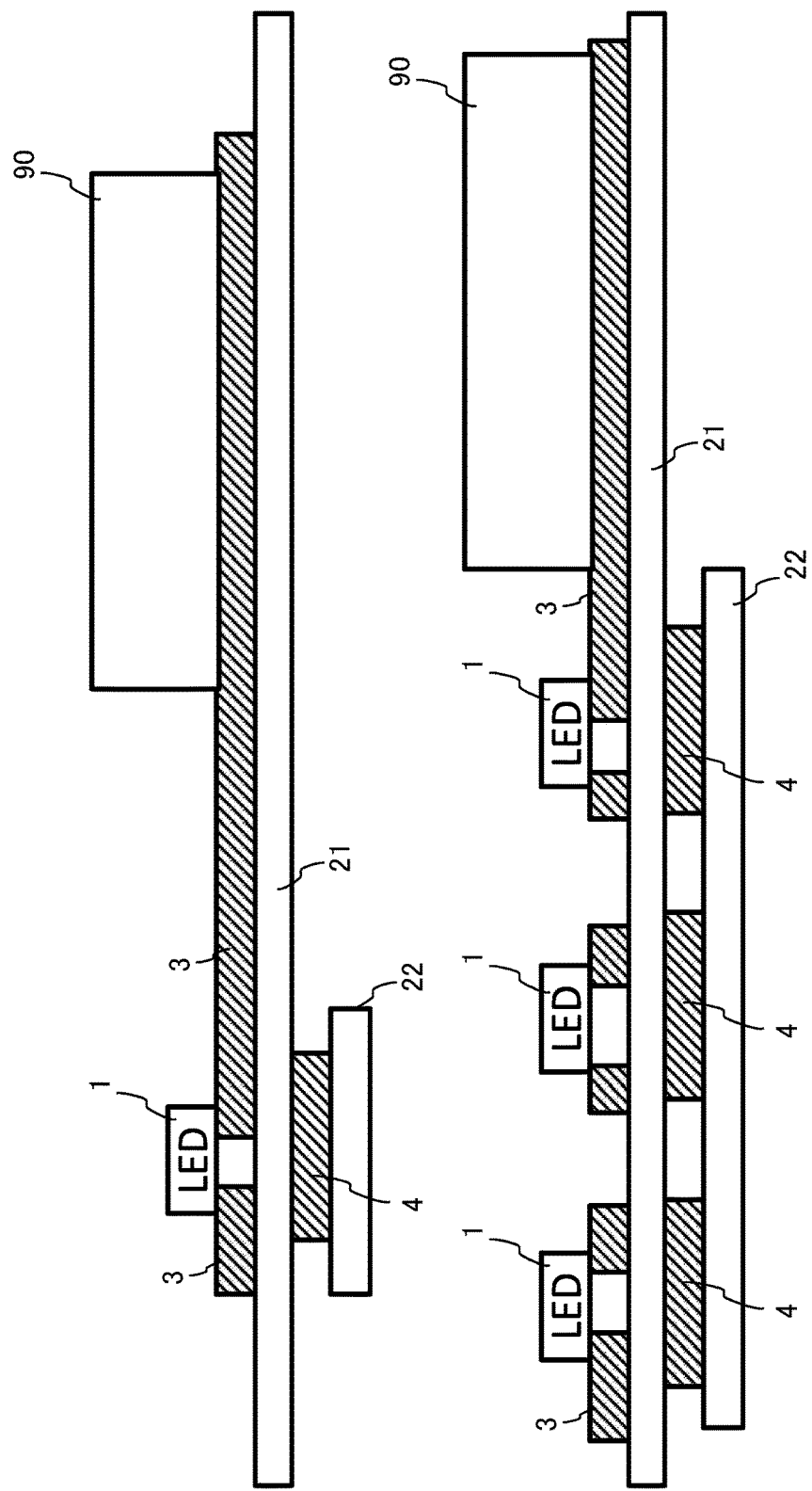

US 10,665,576 B2

OPTICALLY TRANSPARENT PLATE WITH LIGHT EMITTING FUNCTION AND METHOD OF PRODUCING THE SAME

FIELD OF THE INVENTION

The present invention relates to an optically transparent plate, equipped with one or more light sources and capable of emitting light.

DESCRIPTION OF THE RELATED ART

The Japanese unexamined patent application publication No. 2008-234595 (hereinafter, referred to as "Patent Document 1") discloses that an LED is mounted on a plastic substrate such as a credit card, and a color of light emission therefrom is made to vary, thereby presenting payment information. The Japanese unexamined patent application publication No. 2008-217215 (hereinafter, referred to as "Patent Document 2") discloses that an organic EL luminous panel is mounted on a plastic IC card, and a remaining payment amount is displayed according to luminous positions or luminous patterns.

The Japanese unexamined patent application publication No. 2016-184621 (hereinafter, referred to as "Patent Document 3") discloses that a transparent substrate is coated with a solution containing conductive particles dispersed therein, then it is irradiated with light to sinter the conductive particles, so as to form a wiring pattern, and elements such as light emitting elements are mounted on the wiring pattern. Since the conductive particles are subjected to the photonic sintering and a temperature on the substrate is increased locally, it is possible to directly form the wiring pattern without heating the transparent substrate entirely, with maintaining transparency of the substrate.

SUMMARY OF THE INVENTION

When the LED is mounted on the plastic substrate, it is general to employ a packaged LED containing an LED die that is die-bonded on a submount, for example. This is because, when the LED die is bonded to a board via die-bonding or wire-bonding, a temperature at which the substrate is heated (180° C. or higher) may cause deformation of the plastic substrate. As for the organic EL element, it can be directly mounted on a resin film, but since the organic EL is vulnerable to moisture, it is necessary to employ an anti-moisture structure. Currently, the organic EL is required to be encapsulated into a glass-made enclosure. Both the LED package and the glass-made enclosure for the organic EL element have a certain thickness, and this may hinder decreasing of thickness.

On the other hand, as described in the Patent Document 3, according to the method of sintering the conductive particles by using light, the wiring pattern can be formed without damaging the substrate, enabling the LED die to be bonded directly to the wiring pattern on the substrate.

However, when the LED die is bonded directly to the transparent substrate, there may be a problem that light extraction efficiency is low.

An aspect of the present invention is to improve the light extraction efficiency even in a structure where the LED die is mounted directly on an optically transparent substrate.

According to the present invention, there is provided an optically transparent plate comprising an optically transparent substrate, a wiring pattern placed on either of a surface on the upper side and a surface on the underside of the optically transparent substrate, or on the surfaces on both the upper side and the underside thereof, and an LED die bonded to the wiring pattern. A reflective layer is placed on the other side, of the surface of the optically transparent substrate on which the LED die is mounted, and both at least a part of the wiring pattern and at least a part of the reflective layer comprise a conductive material obtained by sintering conductive particles.

According to the present invention, the light extraction efficiency can be improved, even in the structure where the LED die is mounted directly on the optically transparent substrate.

BRIEF DESCRIPTION OF THE DRAWINGS

FIG. 1 is a cross-sectional view of an optically transparent plate with a light emitting function according to a first embodiment;

FIG. 3A illustrates directional properties of light emitted from the optically transparent plate with the light emitting function according to the first embodiment, and FIG. 3B illustrates the directional properties of the light emitted from the optically transparent plate as a comparative example;

FIG. 5 is a partial cross-sectional view of another example of the optically transparent plate with the light emitting function according to the first embodiment;

FIG. 6 is a partial cross-sectional view of still another example of the optically transparent plate with the light emitting function according to the first embodiment;

FIGS. 11A to 11E are partial top views of the optically transparent plate with the light emitting function according to the second embodiment;

FIG. 12 is a partial cross-sectional view of a configuration where the optically transparent plate with the light emitting function according to the second embodiment is further provided with the optically transparent film;

FIG. 13 is a partial cross-sectional view of a configuration where the optically transparent plate with the light emitting function according to the second embodiment is further provided with the optically transparent film;

FIGS. 14A and 14B are partial cross-sectional views each illustrating a configuration where a notch is provided in the optically transparent film of the optically transparent plate with the light emitting function according to the second embodiment;

FIGS. 15A and 15B are partial cross-sectional views each illustrating a configuration where a notch is provided in the optically transparent film of the optically transparent plate with the light emitting function according to the second embodiment;

FIGS. 19A to 19G illustrate a method of producing the optically transparent plate with the light emitting function according to the second embodiment;

FIG. 22A is a partial cross-sectional view of another example of the optically transparent plate with the light emitting function according to the third embodiment, and FIG. 22B is a partial cross-sectional view of the optically transparent plate as a comparative example.

FIG. 24A is a partial cross-sectional view and FIG. 24B is a partial top view of the optically transparent plate with the light emitting function according to a fourth embodiment;

FIGS. 28A to 28G illustrate a method of producing the optically transparent plate with the light emitting function according to the sixth embodiment;

FIG. 31A is a cross-sectional view showing another example of the optically transparent plate with the light emitting function, and FIG. 31B is a cross-sectional view showing still another example of the optically transparent plate with the light emitting function.

DETAILED DESCRIPTION OF THE PREFERRED EMBODIMENTS

Embodiments of the present invention will now be described with reference to the accompanying drawings.

First Embodiment

Figure 2B:
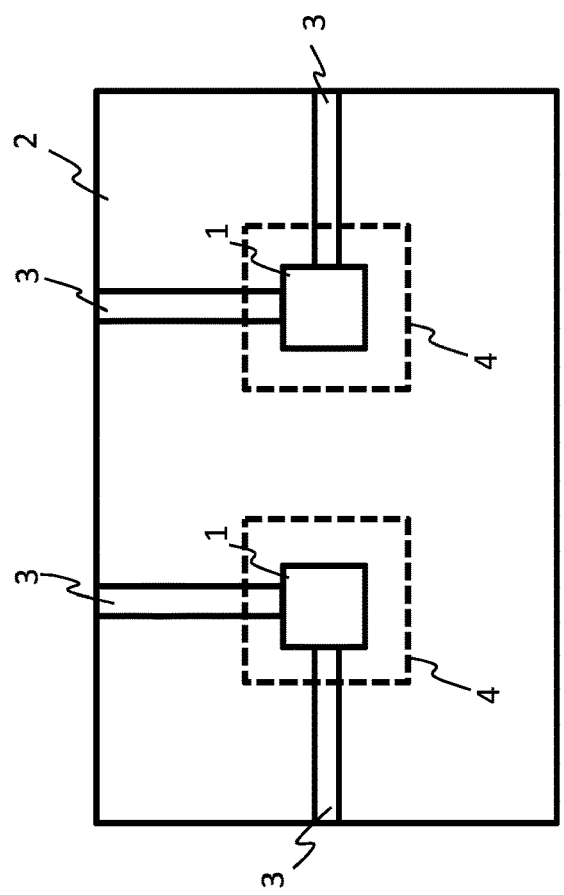
FIG. 2A is a partial cross-sectional view and FIG. 2B is a partial top view of the optically transparent plate with the light emitting function according to the first embodiment.
Figure 2A:
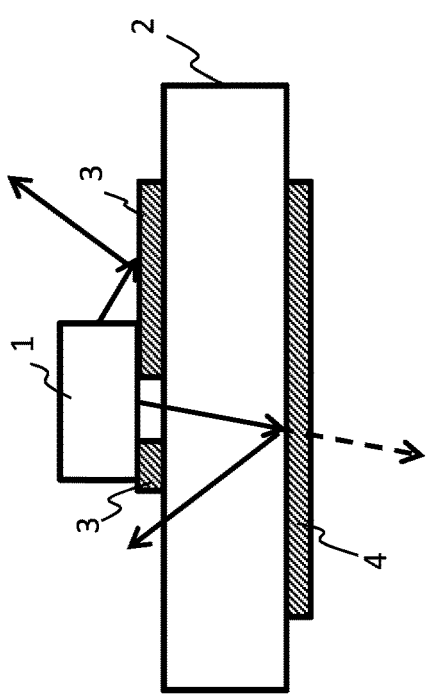

An optically transparent plate with a light emitting function according to a first embodiment comprises an optically transparent substrate 2, a wiring pattern 3 provided on a surface of the optically transparent substrate 2, and an LED die 1 bonded to the wiring pattern 3, as illustrated by a cross-sectional view of FIG. 1 and a partial cross-sectional view and a top view of FIGS. 2A and 2B. A reflective layer 4 is placed on the underside of a region where the LED die 1 is mounted on the optically transparent substrate 2. Both at least a part of the wiring pattern 3 and the reflective layer 4 comprise a conductive material obtained by sintering conductive particles. In addition, the LED die 1 is bonded to the wiring pattern 3 via the conductive material obtained by sintering the conductive particles.

As described above, the wiring pattern 3 is made of conductive material obtained by sintering conductive particles, and in addition, the LED die 1 is bonded to the wiring pattern 3 via the conductive material obtained by sintering the conductive particles. Under these circumstances, heating is performed locally by electromagnetic waves or microwaves, such as heat and light, and this allows the wiring pattern 3 to be formed with fine lines, along with achieving a small joint between the LED die 1 and the wiring pattern 3. With this configuration, even though the optically transparent substrate 2 is made of resin, the LED die 1 can be installed on the optically transparent substrate 2, without loss of transparency or deformation of the optically transparent substrate.

The LED die 1 being unpackaged is extremely small, i.e., in size of a few millimeters square, in general. Therefore, installation of such LED die on the optically transparent substrate 2 enables provision of a thin optically transparent plate with the light emitting function. If a resin film is employed as the optically transparent substrate 2, a much thinner and flexible optically transparent plate (film) can be provided.

In the present embodiment, the reflective layer 4 is arranged at a region on the underside of the optically transparent substrate 2, this region corresponds to a region where the LED die 1 mounted on the upper side of the optically transparent substrate 2. With this configuration, as shown in FIG. 3A, light that is emitted toward the underside, as a part of the light emitted from the LED die 1, can be reflected upward by the reflective layer 4. Thus, the light emitted from the LED die 1 can be extracted more efficiently in the upper part, that is, light extraction efficiency in the upper part can be improved more than the case where the reflective layer 4 is not provided.

In the present embodiment, the reflective layer 4 is also made of conductive material obtained by sintering the conductive particles, and therefore, this allows the optically transparent substrate 2 to be formed without loss of transparency.

The LED die 1, the wiring pattern 3, and the reflective layer 4 are small in area, and thus a light-shielding area may also be made small, with respect to the total area of the optically transparent substrate 2. Therefore, the configuration as shown in FIG. 1 where the LED dies, more than one, are mounted on the optically transparent substrate 2, may provide an optically transparent plate that allows external light to pass through the space between the small LED dies 1, between the wiring patterns 3, and between the reflective layers 4, so that the external light penetrates in the optically transparent substrate 2 in the case where the LED dies 1 are not illuminated.

On the other hand, in the case where the LED dies 1 are illuminated, this configuration provides a light emitting plate that allows the external light to penetrate in the optically transparent substrate 2, and allows the light emitted from the LED die 1 to be emitted upward directly or emitted upward after reflected by reflective layer 4 and the wiring pattern 3.

As illustrated in FIG. 3A, the light emitted from the LED dies 1 shows directional properties that light strength in the lateral direction is more intensified with the placement of the reflective layers 4, than the configuration of the comparative example (FIG. 3B) where no reflective layer is provided. This may enlarge overlap of the directional properties of the light, which is emitted from the LED dies 1 adjacent to each other, more reducing unevenness in light intensity in the principal-plane direction of the optically transparent substrate 2, in contrast to the comparative example. In addition, if wavelengths of the light emitted from the LED dies 1 adjacent to each other are different, this may further enlarge the overlap of the directional properties, whereby inconsistencies in color mixture can be more reduced in contrast to the comparative example.

Figure 4:
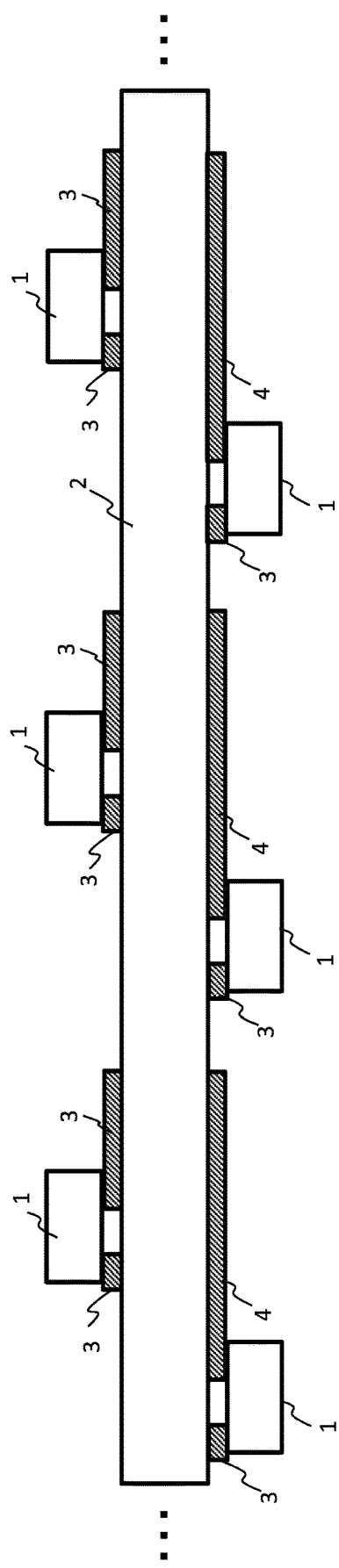
FIG. 4 is a cross-sectional view of another example of the optically transparent plate with the light emitting function according to the first embodiment.

As shown in FIGS. 4 to 6, the LED die 1 may be mounted also on the underside of the optically transparent substrate 2. In the configuration as shown in FIG. 4, the LED die 1 on the underside may be bonded to the reflective layer 4, and the reflective layer 4 may also serve as the wiring pattern 3 for the LED die 1 that is mounted on the underside. Further, as shown in FIG. 6, a second reflective layer 4 may be placed in a region on the upper surface of the optically transparent substrate 2, above the region where the LED die 1 is placed on the underside. Directing upward the light emitted from the LED die 1 on the underside (toward the side of the optically transparent substrate 2), may provide an optically transparent plate that allows both the light emitted from the LED die 1 mounted on the upper side and the light emitted from the LED die 1 mounted on the underside to be directed upward. As shown in FIG. 6, it is further possible to configure the optically transparent plate such that the light emitted upward from the LED die 1 on the underside is reflected by the second reflective layer 4 on the upper side, and is further reflected by the reflective layer 4 on the underside, and is emitted upward. Furthermore, directing downward the light emitted from the LED die 1 on the underside (to the direction opposite to the optically transparent substrate 2 side) may provide a double-surface emission optically transparent plate, enabling light emission from both upward and downward from the optically transparent substrate 2. In those cases above, when the wavelengths of the light emitted from the neighboring LED dies 1 are different from one another, the directional properties (diffusibility) of the light from the LED dies 1 may become various, due to the light reflection according to the reflective layer 4, and this may enhance the color mixture properties.

Figure 7:
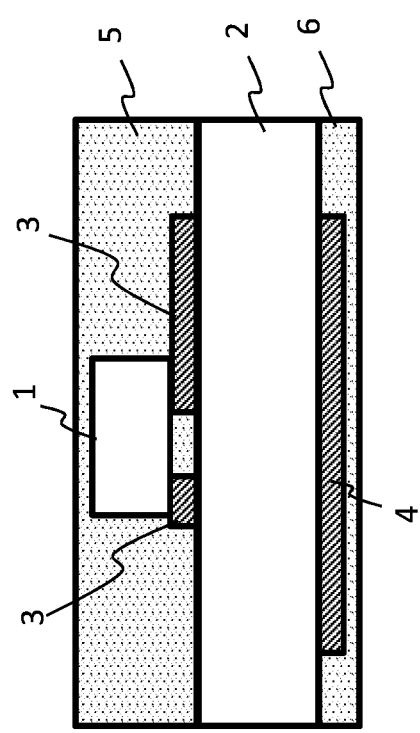
FIG. 7 is a partial cross-sectional view of a configuration where the optically transparent plate with the light emitting function according to the first embodiment is further provided with an optically transparent film.

Alternatively, as shown in FIG. 7, an optically transparent film 5 may be provided on the surface of the optically transparent substrate 2, in a manner that the LED die is embedded therein. With the optically transparent film 5 provided as such, a refractive index difference between the LED die 1 and the optically transparent film 5 becomes smaller than the refractive index difference between the LED die 1 and the air, thereby improving the light extraction efficiency from the LED die 1. In addition, since the optically transparent film 5 has barrier properties, this may enhance corrosion resistance of both the LED die 1 and the wiring pattern 3. As shown in FIG. 7, the underside of the substrate 2 may also be provided with the optically transparent film 6 having the barrier properties, thereby enhancing the corrosion resistance of the reflective layer 4.

Figure 8A:
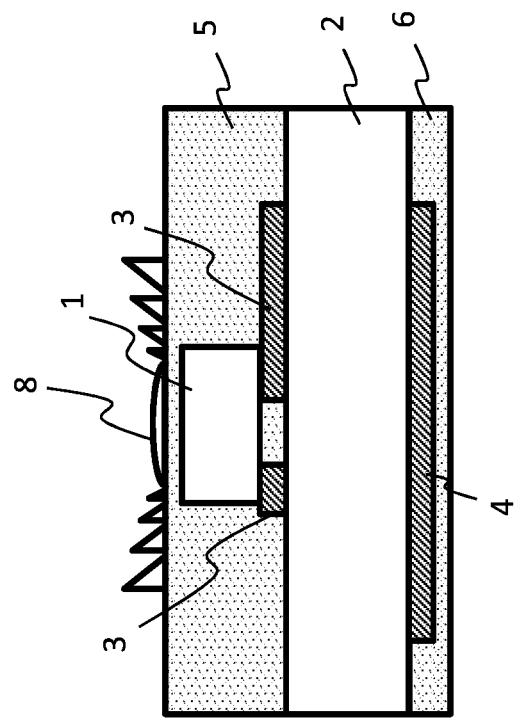
FIG. 8A and FIG. 8B are partial cross-sectional views each illustrating that the optically transparent plate with the light emitting function according to the first embodiment is further provided with a lens.
Figure 8B:
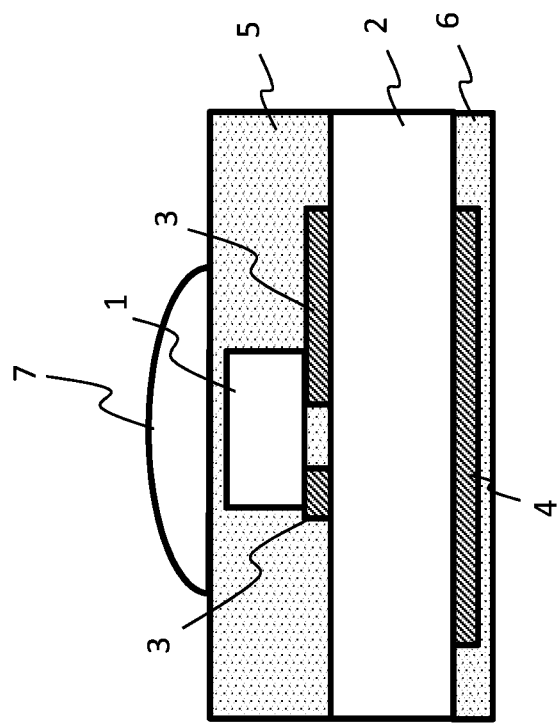

As shown in FIGS. 8A and 8B, a lens 7 or a Fresnel lens 8 may be placed on the surface of the optically transparent film 5 above the LED die. This configuration may improve the light extraction efficiency from the optically transparent film 5, further enabling control of optical properties such as orientation and directivity. When the Fresnel lens 8 is employed, this allows decrease of thickness, relative to the case where the lens 7 is employed. Methods for forming the lens 7 or the Fresnel lens 8 on the surface of the optically transparent film 5 may include, for example, a machining method and a transferring method using a mold or the like. Alternatively, a method for bonding a lens that is formed separately in advance may be employed. In addition, the lens 7 or the Fresnel lens 8 may be an integral part of the optically transparent film 5.

The optically transparent plate of the present embodiment includes the wiring pattern 3 at least a part of which comprises a conductive material obtained by sintering the conductive particles. Local heating may be applied for sintering of the conductive particles. By way of example, thermal sintering by radiating electromagnetic waves such as light and microwaves is performed. Specifically, the electromagnetic waves being applicable may include wavelength ranges of the ultraviolet light, visible light, infrared light, and microwave. In performing the electromagnetic sintering, electromagnetic waves are focused and applied appropriately to the conductive particles on a location where the wiring pattern 3 is to be formed on the optically transparent substrate 2. With this configuration, a region to be heated when the wiring pattern 3 is formed may be extremely localized, such as limited to the extent of a spot diameter of the electromagnetic waves thus focused, and such localized heat is thermally conducted to the surrounding optically transparent substrate 2, followed by discharging the heat into the air. Implementation of this method may prevent a rise of the temperature of the optically transparent substrate 2, and the wiring pattern 3 can be formed without damaging the optically transparent substrate 2. Accordingly, it is also possible to employ a resin or a similar material to form the optically transparent substrate 2.

In performing the electromagnetic sintering, it may be combined with thermal sintering as appropriate, thereby forming the wiring pattern 3 that is fine and electrically low in resistance, with a large ratio of thickness to the wiring width (aspect ratio). This allows the area covered by the wiring pattern 3 to be small on the optically transparent substrate 2. The area where external light and light from the LED die 1 is blocked by the wiring pattern 3 is made smaller, whereby transparency of the optically transparent substrate 2 may be maintained. With this configuration, the area covered by the wiring pattern 3 on the optically transparent substrate 2 can be made smaller, together with achieving electrically low resistance. By way of example, the ratio of the thickness to the width of the wiring pattern 3 is preferably thickness/width=1/100 or higher, and more preferably, thickness/width=5/100 or higher. In addition, thickness/width=10/100 or higher is particularly preferable. If large current is supplied to the wiring pattern 3, it is preferable that thickness/width=20/100 or higher. If the thickness of the wiring pattern 3 is larger than the width thereof, it is much more preferable.

As an example, the wiring pattern 3 should be formed in a size approximately 1 μm or more in width and 1 nm to 50 μm in thickness. An electrical resistance ratio of the wiring pattern 3 is preferably $10^{-4}$ Ω·cm or less, and in particular, it is more preferable that the resistance should be low in the order of $10^{-6}$ Ω·cm.

It is also possible to employ an electromagnetic wave having a wavelength that is absorbed by ink material containing conductive particles used for forming the wiring pattern 3, the wavelength also allowing passage through the optically transparent substrate 2. According to radiation of such electromagnetic waves, the wiring pattern 3 with a fine structure can be formed without focusing the electromagnetic waves in forming the wiring pattern 3. Also in this case, the electromagnetic waves are allowed to pass through the optically transparent substrate 2, and even though it is irradiated entirely, only the portion of the wiring pattern 3 may be heated, without increasing the temperature on the light transmission substrate 2 itself due to absorption of the electromagnetic waves.

In addition, by performing the electromagnetic sintering or similar processing, the wiring pattern 3 may be formed along with adhered directly to the optically transparent substrate 2. Thus, the wiring pattern 3 is allowed to perform efficient thermal conduction of heat that is generated upon light emission from the LED die 1, to the optically transparent substrate 2. Accordingly, heat dissipation capacity of the LED die 1 can be improved.

A part of the wiring pattern 3 may be made of material other than the conductive material obtained by sintering the conductive particles. By way of example, the wiring pattern 3 may be formed by the following steps; a metallic material such as copper foil is affixed to the surface of the substrate 2, a desired wiring shape is formed by an etching method or a similar method, and soldering is performed as necessary.

Preferably, the LED die 1 should be bonded to the wiring pattern via electromagnetic sintering. By employing the electromagnetic sintering method, it is possible to bond the LED die 1 to the wiring pattern 3, while preventing a rise of the temperature of the optically transparent substrate 2. The LED die 1 may be bonded to the wiring pattern 3, simultaneously with forming the wiring pattern 3. Alternatively, after forming the wiring pattern 3, a material containing the conductive particles may be applied to the wiring pattern 3, and after mounting the LED die 1 thereon, the LED die 1 may be bonded to the wiring pattern 3 via electromagnetic sintering.

In the case where the LED die 1 is bonded to the wiring pattern 3 via electromagnetic sintering, even when the optically transparent substrate 2 is bent and a distortion stress is applied, rupture or peeling may hardly occur at the joint, and therefore durability is improved.

FIG. 1 illustrates an example where the wiring pattern 3 is formed on the surface of the optically transparent substrate 2 for mounting the LED die 1 thereon, but a part of the wiring pattern 3 may be placed on the underside of the optically transparent substrate 2. In this case, the part of the wiring pattern 3 placed on the underside may also serve as the reflective layer 4.

In the present embodiment, a thin substrate or film, for example, 10 to 1,000 μm in thickness, may be employed as the optically transparent substrate 2. Even though the substrate 2 is thin as such, electromagnetic sintering allows installation of the LED die 1 as described in the present embodiment. As a material of the optically transparent substrate 2, glass may be used, or a material containing organic substances as major components may be used, such as PS (polystyrene), PP (polypropylene), PC (polycarbonate), PET (polyethylene terephthalate), PEN (polyethylene naphthalate), polyimide, acrylic, epoxy, and silicone. The optically transparent substrate 2 can be formed by any of the known methods, such as melt-extrusion molding, solution casting, and calendaring. The optically transparent substrate 2 may be subjected to surface treatment, in order to improve adhesion between the optically transparent substrate 2 and the conductive material constituting the wiring pattern 3 and the reflective layer 4. For example, plasma treatment, UV (ultraviolet ray) treatment, treatment for coating with coupling agents, or similar treatment, may be performed.

As the conductive particles used for forming the wiring pattern 3, it is preferable to use one or more of conductive metals such as Au, Ag, Cu, Pd, ITO, Ni, Pt, and Fe, and conductive metal oxides thereof. In order to perform the electromagnetic sintering efficiently, it is desirable to improve the electromagnetic-wave absorption characteristics of ink containing the conductive particles, and it is also desirable that some or all of the conductive particles should be nanosized in shape. The contained particle may be 10 to 150 nm in size, for example.

As the LED die 1, a die that emits light with a desired wavelength may be employed.

Preferably, a material of the optical transparent films 5 and 6 should be light penetrating. For example, the material may be glass, or an optically transparent resin material, such as silicone, epoxy, PS (polystyrene), PP (polypropylene), PC (polycarbonate), PET (polyethylene terephthalate), PEN (polyethylene naphthalate), polyimide, urethane, and fluororesin. In particular, it is desirable, for example, to use a material having barrier properties, such as EVOH (ethylene vinyl alcohol copolymer), epoxy, silicone, and acrylic.

<Method of Producing Optically Transparent Plate with Light Emitting Function>

Next, with reference to FIGS. 9A to 9E, a method of producing the optically transparent plate with the light emitting function according to the first embodiment will be described. Here, there will be described an example where the wiring pattern 3 is obtained by sintering of a solution (ink) containing conductive particles with a solvent and a dispersing agent with the use of electromagnetic waves as the light.

Figure 9A:
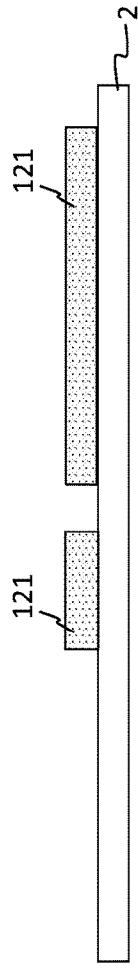
FIGS. 9A to 9E are cross-sectional views showing a method of producing the optically transparent plate with the light emitting function according to the first embodiment.

Firstly, as shown in FIG. 9A, the solution (ink) where the conductive particles are dispersed is prepared, and the solution is applied to the surface of the optically transparent substrate 2 in a desired shape. As a method for applying the solution, any of the methods may be employed, such as inkjet printing, dispensing, flexography, gravure printing, gravure-offset printing, and screen-printing method. According to the process above, a film 121 of the conductive particles is formed on the surface of the optically transparent substrate 2. The film 121 is heated if necessary, allowing the solvent to evaporate to dryness. The ink may be applied in a manner that the film 121 becomes the shape of the wiring pattern 3 to be formed, or it may be a uniform film. If the film is uniform, a region other than the wiring pattern 3 is removed in a subsequent step.

Figure 9B:
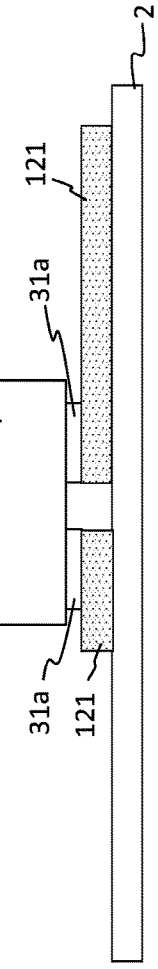
Figure 9C:
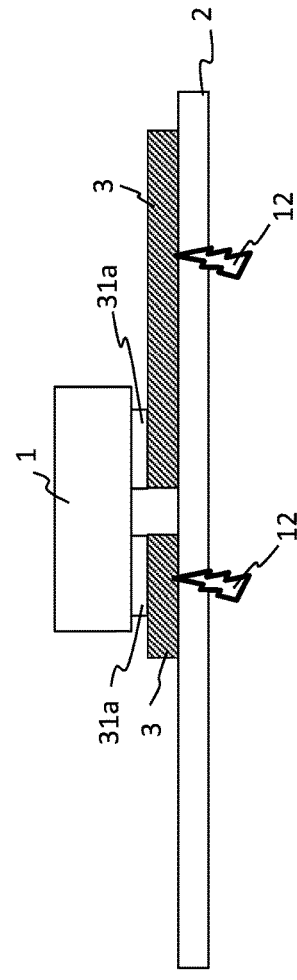

For sintering of fine particles in the unsintered film 121 thus formed, only the wiring part is locally irradiated with the electromagnetic waves or light, for instance, thereby heated, and accordingly, the conductive particles undergo sintering. A pulse wave of light like a flash lamp, a continuous wave like laser light, and a long-wavelength electromagnetic wave like microwave, may be used as the electromagnetic wave. In here, light is used as an example. Firstly, as shown in FIG. 9B, the LED die 1 is mounted on the unsintered wiring pattern 3, in a manner that the electrodes 31a thereof come into contact with the film 121. Next, as shown in FIG. 9C, light beams 12 are made to pass through the optically transparent substrate 2, and applied to the film 121. According to this method, for example, irradiation of the light beam 12 enables formation of the wiring pattern 3 and connection between the LED die 1 and the wiring pattern 3, simultaneously or continuously. Specifically, a region between the electrodes 31a and the optically transparent substrate 2 is irradiated with the light beam 12, from the side where the film 121 is not formed, thereby subjecting the conductive particles of the film 121 to electromagnetic sintering, and forming a part of the wiring pattern 3 that serves as a connection region with the electrodes 31a. The light beam 12 is further applied, so as to form the other part of the wiring pattern 3. As an alternative forming sequence, the part of the wiring pattern 3 which serves as the connection region for connecting the electrodes of the LED die 1 may be formed, subsequent to forming the other part of the wiring pattern.

It is also possible that, after forming the wiring pattern 3, unsintered conductive-particle containing ink is additionally applied to the region between the wiring pattern 3 and the electrodes 31a, and then, the electrodes 31a of the LED die 1 are mounted, followed by irradiated with the light beam 12, thereby forming the region for connecting the electrodes.

Figure 9D:
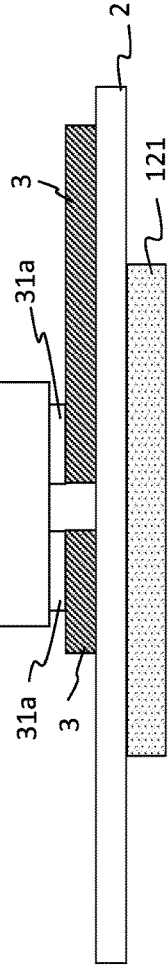

Next, as shown in FIG. 9D, the solution (ink), or the like, where conductive particles are dispersed, is applied to the underside of the optically transparent substrate 2, in the shape of the reflective layer 4, and the unsintered film 121 is formed. The solution and the application method are the same as those in the step of FIG. 9A.

Figure 9E:
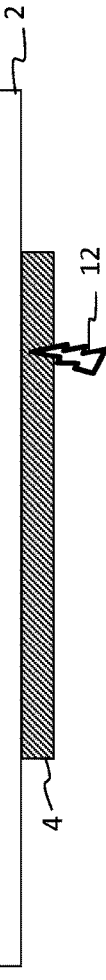

Finally, as shown in FIG. 9E, the film 121 is irradiated with the light beam 12 and undergoes sintering, and then, the reflective layer 4 is formed. According to the process as described above, the optically transparent plate with the light emitting function is produced. In order to perform simultaneous sintering on both the wiring pattern 3 and the reflective layer 4, it is further possible to take a structure that both are irradiated with light simultaneously.

There will now be described a mechanism how the conductive particles irradiated with the light beam 12 undergo sintering. In a region irradiated with the light beam 12 on the film 121, the conductive particles absorb the light energy, causing a rise of the temperature of the region. Accordingly, the conductive particles melt at a temperature lower than a melting point of bulk material constituting the particles, and along with the rise of the temperature in the conductive particles, the melting conductive nanoparticles directly fuse with adjacent particles. Then, the conductive particles undergo sintering with one another, thereby forming the wiring pattern 3 being conductive on the upper surface of the optically transparent substrate 2. Then, the melting conductive particles are adhered to the optically transparent substrate 2. In particular, as shown in the step of FIG. 9C, the light beam 12 is applied from the side of the optically transparent substrate 2 where the film 121 is not formed, thereby increasing the adhesion strength of the interface between the optically transparent substrate 2 and the wiring pattern 3.

As described above, the temperature of the conductive particles in the film 121 within the region that is irradiated with the light beam 12, rises due to the light irradiation, and the heat caused by irradiation is used for sintering of the conductive particles, along with being conducted to the surrounding film 121 and to the optically transparent substrate 2, and then, the heat is dissipated. Therefore, the temperature only within the region irradiated with the light beam 12 on the film 121, or only in the region irradiated with the light beam 12 and a region in the vicinity thereof, reaches a level that allows the conductive particles to undergo sintering. On the other hand, the temperature of the surrounding region on the film 121 other than the irradiated region as described above and the temperature of the optically transparent substrate 2 may not be raised to a level that melts or changes properties of the constituent materials. In other words, in the present embodiment, only a partial region on the film 121 is irradiated with the light beam 12, thereby preventing the optically transparent substrate 2 from a rise in temperature, deformations or distortion, and deteriorations such as white turbidity caused by electromagnetic sintering of the optically transparent substrate 2. If the optically transparent substrate 2 is flexible, such flexible properties can be maintained. It should be noted that the method of light irradiation is not limited to the method as described above, but the optically transparent substrate may be irradiated entirely with flash light or the like, for the sintering of the film 121.

In the steps of FIGS. 9C and 9E, it is desirable that the formed wiring pattern 3 and reflective layer 4 should become porous. In other words, the whole adjacent conductive particles are not completely melted to be mixed, but preferably, the contact interface undergoes electromagnetic sintering at a temperature that allows a pore to be formed at least partially between the conductive particles after the sintering. By way of example, laser light is used as the light beam 12, and the film 121 is irradiated with the laser light at irradiation strength to the extent that it may not melt the optically transparent substrate 2 through which the light passes. Accordingly, this allows relatively large energy to be applied to the region on the film 121 that is irradiated with the light beam 12 within a short period of time, and the conductive particles can be heated and molten and undergo sintering. When irradiation of the light beam 12 of laser light is stopped, cooling is performed immediately due to thermal conduction to the surrounding film 121 and to the optically transparent substrate 2, whereby a porous wiring pattern can be formed. In other words, when the light beam 12 of laser light performs sintering of the film 121, the irradiation strength of the light beam 12 can be controlled, so that the temperature of the film 121 becomes appropriate, enabling the porous wiring pattern 3 to be formed. As a specific example, a stretched polyethylene terephthalate (PET) film (the melting point is approximately 250° C. and the heat resistant temperature is approximately 150° C.) is used as the optically transparent substrate 2, the film 121 being irradiated with the light beam 12 of the laser light from the underside of the optically transparent substrate 2, with the strength controlled for maintaining the shape of the optically transparent substrate 2, and then the conductive particles of the film 121 undergo sintering. According to the process above, the porous wiring pattern 3 can be formed.

If the wiring pattern 3 is porous, as described above, the wiring pattern 3 itself is provided with followability (flexibility). Therefore, when the flexible optically transparent substrate 2 is deformed, the wiring pattern 3 follows the deformation, and thus the wiring pattern 3 may hardly peel off the optically transparent substrate 2, and also cracking or similar trouble may hardly occur. Therefore, it is possible to provide the substrate 2 being so flexible that disconnection is unlikely to occur.

In the steps of FIGS. 9C and 9E, the light beam 12 when applied to the film 121, may be adjusted in advance to the shape of the wiring pattern 3, via passing through a mask. Alternatively, the light beam 12 with an irradiation spot in a circular shape or a rectangular shape is made to scan, so as to depict the wiring pattern 3.

In the case where the optically transparent film 5 is provided on the surrounding of the LED die 1 and the optically transparent film 6 is provided on the underside, uncured resin is applied to the optically transparent substrate 2, according to a method such as spray coating, dip coating, and wet coating, followed by curing. Alternatively, a film-like molded member may be bonded according to a method such as lamination method and heat sealing, or a self-adhesive member may be bonded using its adhesion properties.

Specifically, for example, the surrounding of the LED die 1 is filled with an uncured material of the optically transparent film 5 via a desired method, and then it is cured by a desired method such as using heat and UV. It is further possible that a second optically transparent substrate is provided, in a manner facing to the optically transparent substrate 2, placing the LED die 1 therebetween, and the space between the two optically transparent substrates is filled with resin according to capillary phenomenon or vacuum injection technique, and then, they are cured by a desired method. As a material of the optically transparent films 5 and 6, for example, a resin material with light permeability, such as epoxy resin, silicone resin, urethane resin, fluororesin, and acrylic resin, may be employed.

As shown in FIGS. 8A and 8B, for installing the lens 7 or the Fresnel lens 8 on the optically transparent film 5, the lens 7 or the Fresnel lens 8 molded separately in advance may be mounted on the optically transparent film 5, or the optically transparent film 5 may be molded to be suitable for the shape of the lens 7 or the Fresnel lens 8, so that the lens 7 or the Fresnel lens 8 can be integral parts of the optically transparent film 5. When the lens 7 or the Fresnel lens 8 is molded separately, it is possible to employ, as a material thereof, a resin material with light permeability, such as epoxy resin, silicone resin, urethane resin, fluororesin, and acrylic resin, similar to the material of the optically transparent films 5 and 6.

In the steps of FIG. 9C, it is of course possible to irradiate the optically transparent substrate 2 with the light beam 12, from the surface on the side where the film 121 is placed thereon. In this case, electromagnetic sintering cannot be performed on the connection part of the electrodes for mounting the LED die 1, but the other part of the wiring pattern 3 can be sintered. Therefore, the step for forming the electrode connection part and the step for forming the wiring pattern may also be performed in parallel.

A wavelength that is absorbable by the conductive particles contained in the film 121 is used as the wavelength of the light beam 12 for irradiation. The irradiation light may be any of ultraviolet, visible, infrared light and microwave. By way of example, if a material such as Ag, Cu, Au, and Pd is used as the conductive particles, visible light approximately between or equal to 400 nm and 600 nm can be employed.

After finishing each step in FIG. 9, if there remains any region not irradiated on the film 121, it is removed in the subsequent step, since sintering does not occur therein. By way of example, the film 121 can be removed by using organic solvent, or a similar substance. Alternatively, the film 121 may further be subjected to sintering, by irradiated with light or heated additionally.

There will now be described ink that contains conductive fine particles used in the step for forming the wiring pattern 3 and the reflective layer 4. This ink is a solution in which nanosized conductive particles, 1 μm or less, are dispersed. One or more of the following materials may be employed as the conductive particles; conductive metal such as Au, Ag, Cu, Pd, ITO, Ni, Pt, and Fe, and conductive metal oxide thereof. The conductive particles may include only nanosized particles smaller than 1 μm in size, or the nanosized particles of smaller than 1 μm and micro particles of 1 μm or larger may be mixed. Preferably, solvent of the solution may be organic solvent such as alcohol and glycol, or water, and alternatively the particles may be contained in epoxy, silicone, or urethane resin. Additives (including polymer components such as polyvinylpyrrolidone, and amine) for improving dispersibility may be added to the solvent, and further, a resin component (such as epoxy, silicone, and urethane resin) may also be added thereto in order to improve adhesion.

Second Embodiment

With reference to FIGS. 10A to 10O and FIGS. 11A to 11E, there will now be described the optically transparent plate with the light emitting function according to a second embodiment.

Figure 10A:
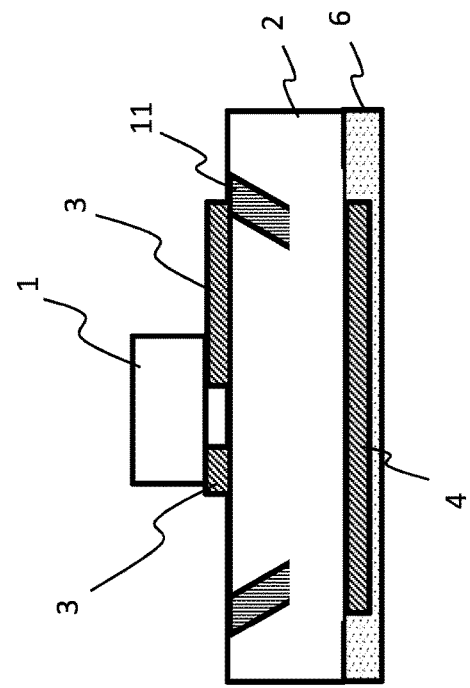
FIGS. 10A to 10O are partial cross-sectional views of the optically transparent plate with the light emitting function according to a second embodiment.

As shown in FIG. 10A, similar to the first embodiment, the optically transparent plate with the light emitting function according to the second embodiment is provided with the optically transparent substrate 2, the wiring pattern 3 placed on the surface of the optically transparent substrate 2, and the LED die 1 bonded to the wiring pattern 3. At least a part of the wiring pattern 3 comprises a conductive material obtained by sintering the conductive particles, and the LED die 1 is bonded to the wiring pattern 3 via the conductive material obtained by sintering the conductive particles. The same reference numerals as those of the first embodiment denote the same configurations as those of the first embodiment.

In the second embodiment, a notch 11 is provided in the vicinity of the LED die 1, in the thickness direction of the optically transparent substrate 2, and the notch 11 is filled with a reflective material.

By providing the notch 11 filled with the reflective material, even though a part of the light emitted from the LED die 1 and incident on the optically transparent substrate 2 travels in the inner plane direction of the optically transparent substrate 2, the light can be reflected upward. Therefore, this may improve the light extraction efficiency of the light emission directed upward from the LED die 1, and also preventing the light from being guided into the inner plane direction of the optically transparent substrate 2.

As shown in FIGS. 11A to 11E, one or more notches 11 are provided to surround the LED die 1. In the examples as shown in FIGS. 11A, and 11C to 11E, the notch 11 is divided into multiple parts, so as to avoid the wiring pattern 3.

In addition, the notch 11 is preferably inclined with respect to the surface of the optically transparent substrate 2. Control of this tilt angle enables control of the direction of the light that has reached the reflective material in the notch 11 and reflected therefrom, via the optically transparent substrate 2.

Preferably, the reflective layer 4 should be placed on the underside of the optically transparent substrate 2, and the region surrounded by the notches 11 should be covered with the reflective layer 4. With this configuration, allowing the light reaching the underside of the optically transparent substrate 2 to be reflected upward by the reflective layer 4, and the light extraction efficiency of the light directed upward can be improved further.

Figure 10B:
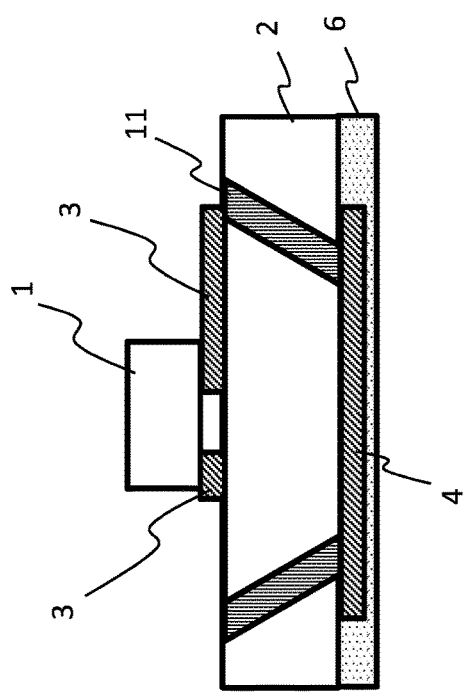

As shown in FIG. 10B, the notch 11 may have a configuration provided halfway through the thickness of the optically transparent substrate 2 (half cut). Since a part of the light can be reflected upward, with the structure of the notch 11 halfway through the thickness, this may also produce an effect of improving the light extraction efficiency.

Figure 10C:
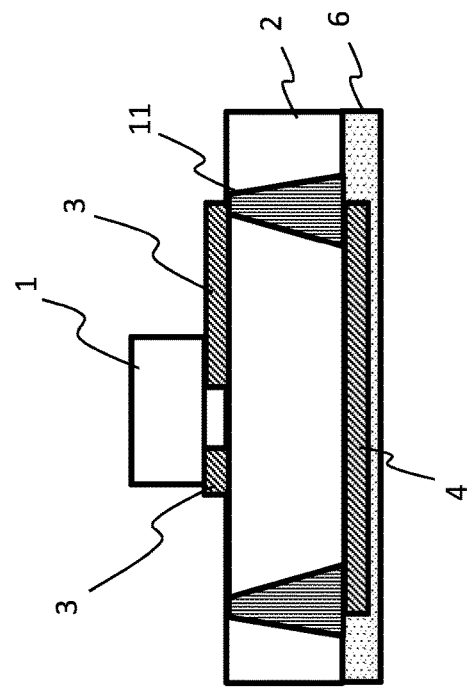

In the structure as shown in FIG. 10C, the notch 11 may be cut into the optically transparent substrate 2 from the underside. As described later, the notch 11 can be made by router processing, laser processing, press working with a mold, or a similar processing. As shown in FIG. 10C, the laser processing has the characteristics that the diameter of the notch on the laser incident side becomes larger than the diameter of the notch on the laser outgoing side. Utilizing those characteristics may allow the side surfaces of the notch 11 to be inclined as shown in FIG. 10C, for example.

Any reflective material may be applicable, which is filled in the notch 11, such as resin with a scattering agent dispersed therein, and a conductive material obtained by sintering conductive particles may also be applicable. In particular, it is more preferable that the material filled in the notch 11 should be the same as the conductive material obtained by sintering the conductive particles constituting the wiring pattern 3, since the notch can be formed continuously from or simultaneously with the step of forming the wiring pattern 3.

In addition, as shown in FIGS. 12 and 13, the upper surface of the optically transparent substrate 2 may be covered with the optically transparent film 5, in a manner that the LED die 1 is embedded therein. In this case, as shown in FIGS. 14A and 14B and FIGS. 15A and 15B, there is provided a second notch 12 in the thickness direction of the optically transparent film 5 in the vicinity of the LED die 1 in the optically transparent film 5, and the second notch 12 may also be filled with the reflective material. The second notch 12 may be provided all through the thickness direction of the optically transparent film 5, or it may be half cut. The second notch 12 may be obtained by notching from the upper side of the optically transparent film 5. Alternatively, it may be provided by notching from the underside of the optically transparent film 5 or of the optically transparent substrate 2.

Then, the second notch 12 filled with the reflective material allows the light travelling in the lateral direction of the optically transparent film 5 to be reflected and emitted upward, thus the light extraction efficiency from the upper side may be improved.

The notch 11 and the second notch 12 may be formed continuously as shown in FIGS. 14A and 15A, or they may be formed discontinuously as shown in FIGS. 14B and 15B.

Figure 16A:
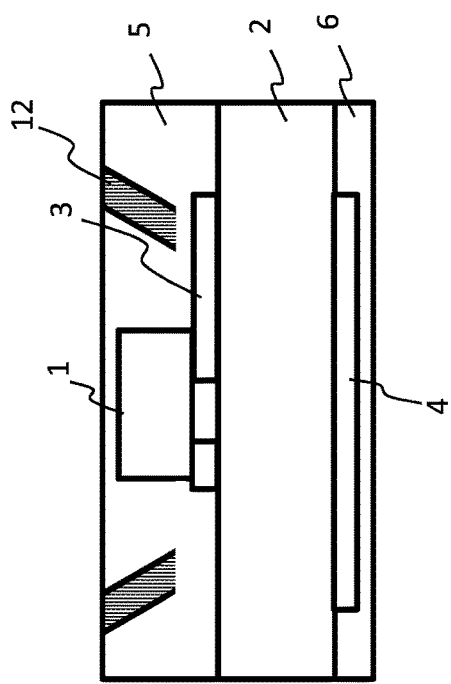
FIGS. 16A and 16B are partial cross-sectional views and FIGS. 16C and 16D are partial top views, each illustrating the configuration where the notch is provided in the optically transparent film of the optically transparent plate with the light emitting function according to the second embodiment.
Figure 16B:
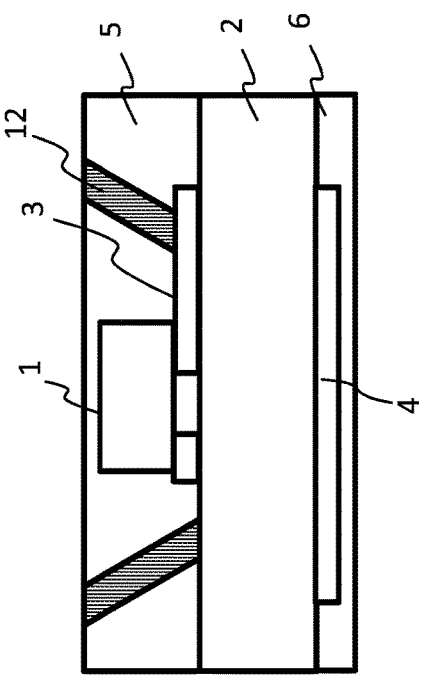
Figure 16C:
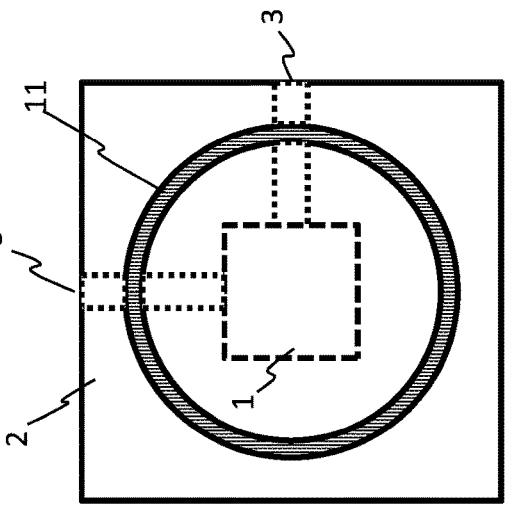
Figure 16D:
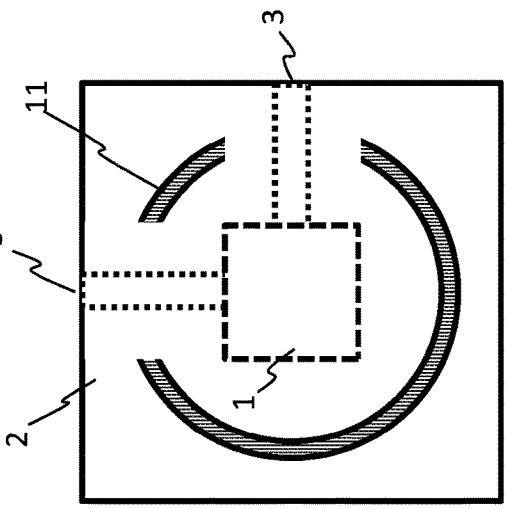
Figure 17A:
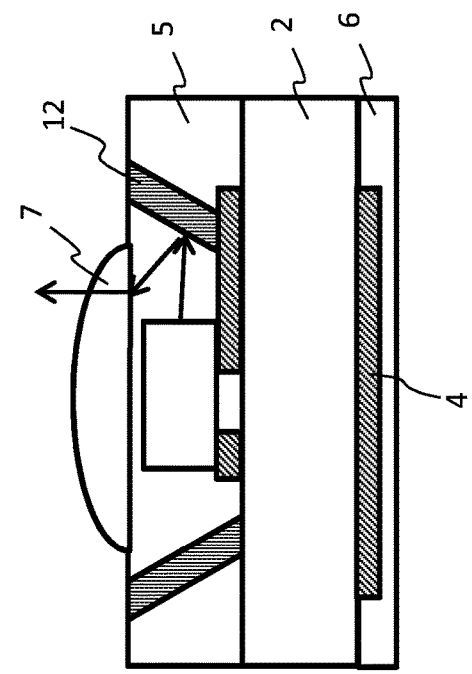
FIGS. 17A to 17D are partial cross-sectional views, each illustrating a configuration where the optically transparent plate with the light emitting function according to the second embodiment, is further provided with a lens.
Figure 17B:
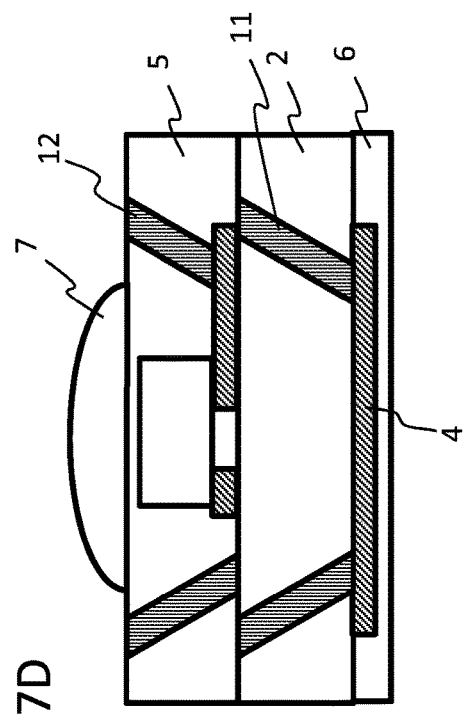
Figure 17C:
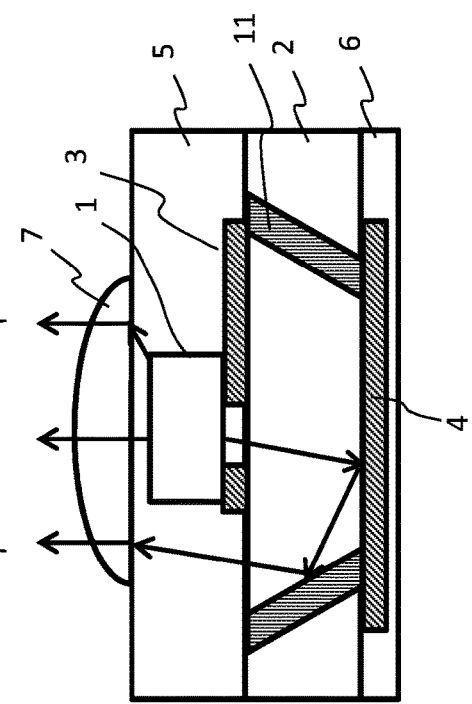
Figure 17D:
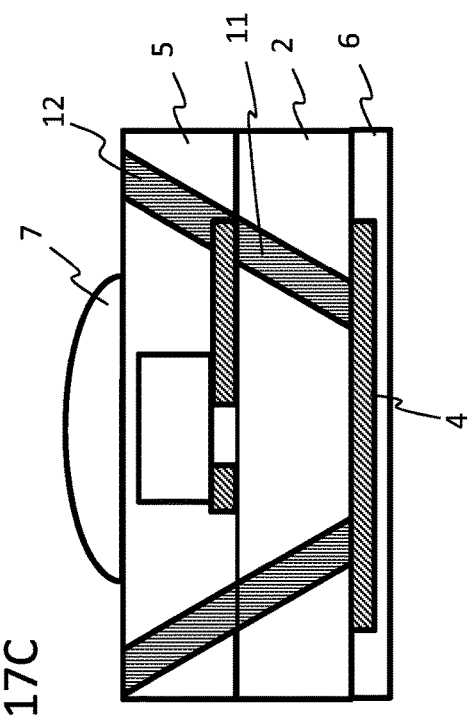
Figure 18A:
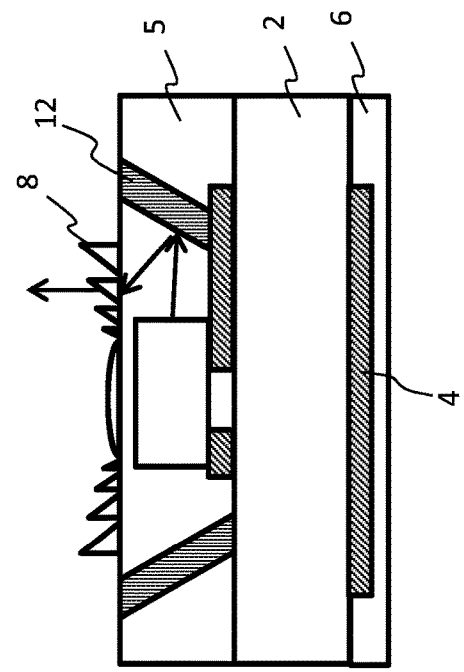
FIG. 18A to 18D are partial cross-sectional views, each illustrating a configuration where the optically transparent plate with the light emitting function according to the second embodiment, is further provided with a lens.
Figure 18B:
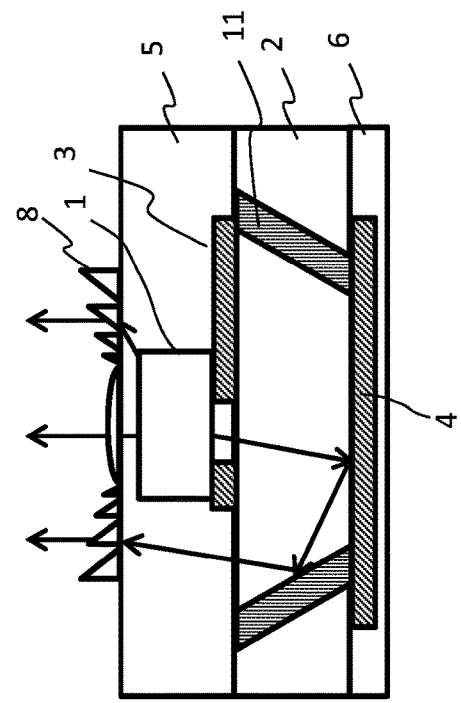
Figure 18C:
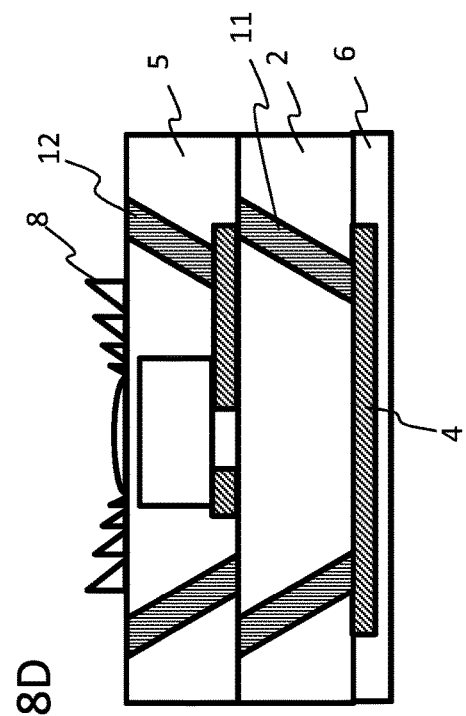
Figure 18D:
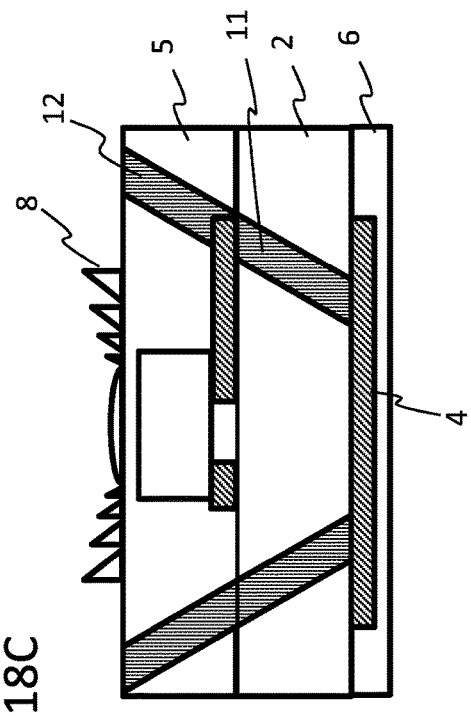

Alternatively, as shown in FIGS. 16A and 16B, the notch 12 may be provided only in the optically transparent film 5, without providing the notch 11 in the optically transparent substrate 2. As shown in the top view of FIG. 16C, the notch 12 may be provided continuously to surround the LED die 1, or as shown in FIG. 16D, the notch may be provided after divided into multiple parts, so as to avoid the wiring pattern 3.

As shown in FIGS. 17A to 17D and FIGS. 18A to 18D, the lens 7 or the Fresnel lens 8 may be placed on the upper surface of the optically transparent film 5, above the LED die 1. According to the operation of the lens 7 or the Fresnel lens 8, the light extraction efficiency of outgoing beams from the LED die 1 can be improved more, and optical properties such as orientation and directivity can be controlled.

Next, there will be described a method of producing the optically transparent plate with the light emitting function according to the second embodiment. In here, an example of producing the optically transparent plate as shown in FIG. 10A will be described.

Firstly, as shown in FIGS. 19A and 19B, the optically transparent substrate 2 is prepared, and the notch 11 is formed. Processing technology such as router processing, lathe works, laser processing, and transfer processing using a mold may be employed as a method for forming the notch 11. The laser processing may facilitate adjustments to the notch in terms of an orientation and angle, a size including a depth, a shape, position, and the like.

Next, as shown in FIG. 19C, similar to the step as shown in FIG. 9A of the first embodiment, ink with conductive particles dispersed therein is applied, or a similar process is performed, to form an unsintered film 121 serving as the wiring pattern 3, along with filling the notch 11 with the ink, and an unsintered filling part 123 is formed.

As shown in FIG. 19D, similar to the step as shown in FIG. 9B of the first embodiment, the LED die 1 is mounted on the film 121.

Then, in the step of the FIG. 19E, similar to the step of FIG. 9C, the film 121 is irradiated with the light beam 12 to sinter the conductive particles, and the wiring pattern 3 is formed, along with bonding the LED die 1 to the wiring pattern 3, and the filling part 123 is also irradiated with the light beam so that the conductive particles undergo sintering therein to form the reflective material. The film 121 and the filling part 123 may be irradiated with the light beam 12, simultaneously or at different times.

Next, in the steps of FIGS. 19F and 19G, similar to the steps of FIGS. 9D and 9E, the uncured film 121 supposed to be used as the reflective layer 4, is formed with the ink where the conductive particles are dispersed, and then, it is irradiated with the light beam 12 and sintered, whereby the reflective layer 4 is formed. According to the steps above, the optically transparent plate with the light emitting function as shown in FIG. 10A can be produced.

Next, with reference to FIGS. 20A to 20G, another method of producing the optically transparent plate as shown in FIG. 10A will be described. The production method as shown in FIGS. 20A to 20G, is different from the production method as shown in FIGS. 19A to 19G, in terms of the timing for forming the notch 11.

Figure 20A:
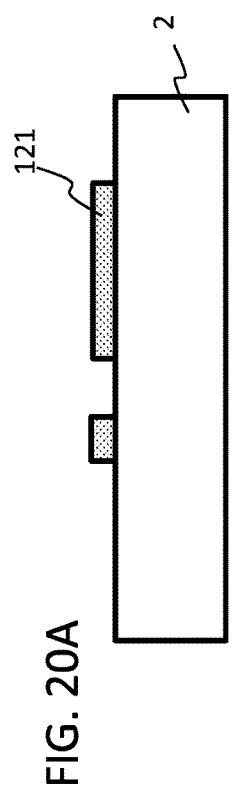
FIGS. 20A to 20G illustrate a method of producing the optically transparent plate with the light emitting function according to the second embodiment.
Figure 20B:
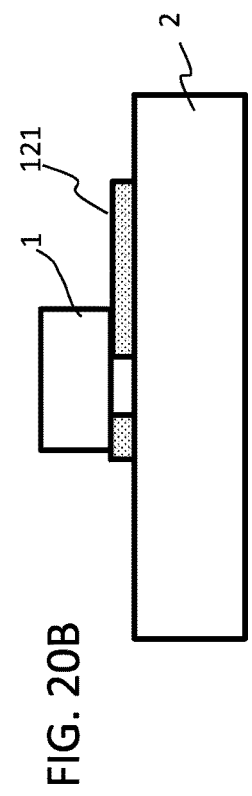
Figure 20C:
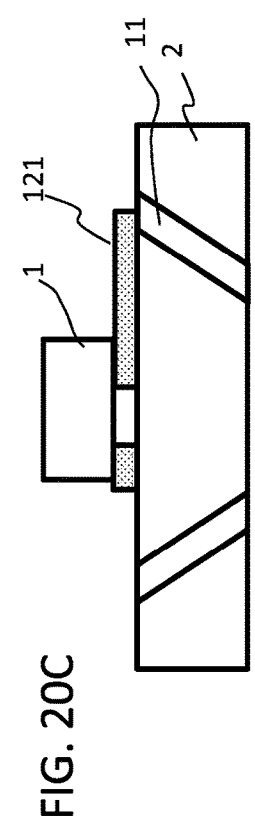
Figure 20D:
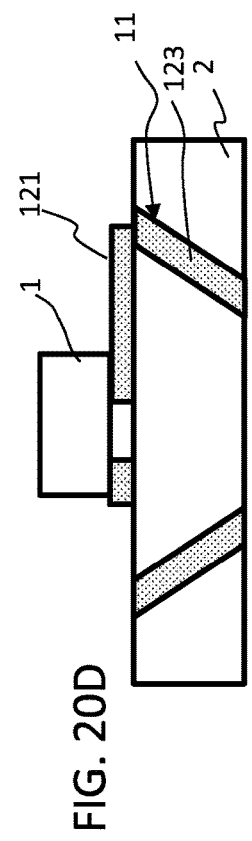
Figure 20E:
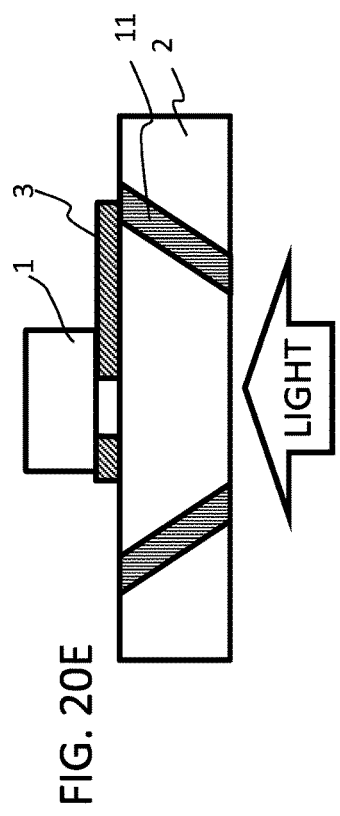
Figure 20F:
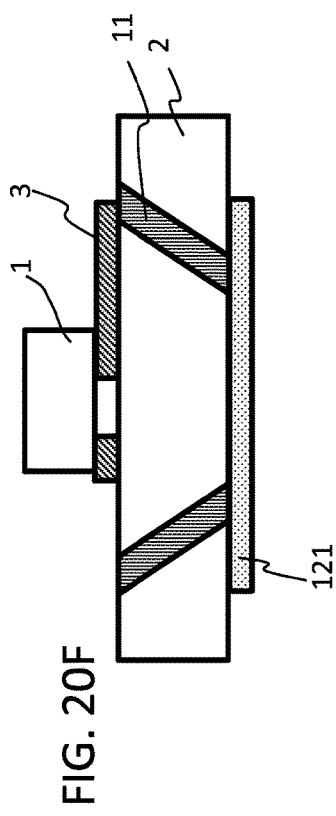
Figure 20G:
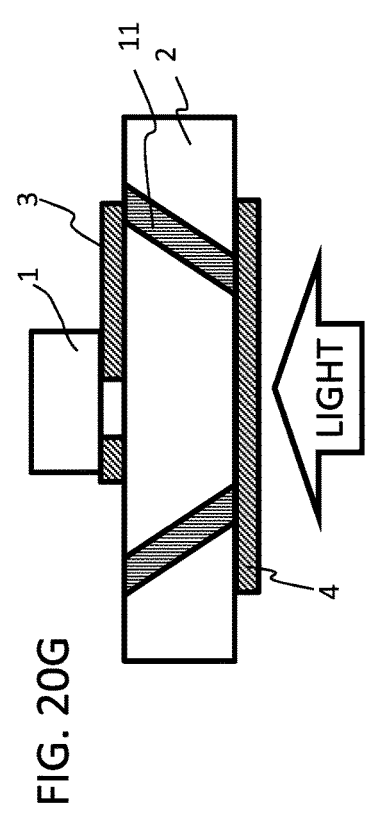

Firstly, as shown in FIGS. 20A and 20B, prior to forming the notch 11, an uncured film 121 is formed, which serves as the wiring pattern 3, and the LED die 1 is mounted thereon. In this state, the notch 11 is formed as shown in FIG. 20C, and it is filled with ink where the conductive particles are dispersed, so as to form the filling part 123. Subsequently, in the step of FIG. 20E, similar to the step of FIG. 19E, the film 121 is irradiated with the light beam 12 to sinter the film 121, thereby forming the wiring pattern 3, along with bonding the LED die 1 to the wiring pattern 3, and simultaneously the filling part 123 undergoes sintering to be changed to the reflective material. In the steps of FIGS. 20F and 20G, similar to the steps as shown in FIGS. 19F and 19G, the reflective layer 4 is formed. According to the steps above, the optically transparent plate with the light emitting function as shown in FIG. 10A can be produced.

The notch 11 may be formed prior to forming the wiring pattern 3, or subsequent to forming the wiring pattern 3. The notch 11 may be formed prior to forming the uncured film 121 serving as the wiring pattern 3, or prior to forming the uncured film 121 serving as the reflective layer 4. The notch 11 may be filled with the ink where conductive particles are dispersed, simultaneously with forming the film 121 that serves as the wiring pattern 3 or with forming the film 121 that serves as the reflective layer 4, or may be performed at different times. It is of course possible that the ink where the conductive particles are dispersed undergoes sintering individually, in the film 121 serving as the wiring pattern 3, in the film 121 serving as the reflective layer 4, and in the notch 11. Alternatively, by taking a structure that allows collective irradiation of light, sintering may be performed in one operation, according to simultaneous irradiation of light. Since the conductive-particle dispersed ink that undergoes sintering within the notch 11 has conductivity, it may also be used as a via-hole.

In any of the production steps as shown in FIGS. 19 and 20, the wiring pattern 3 and the reflective material in the notch 11 can be sintered simultaneously, and thus it is possible to produce the optically transparent plate provided with the notch 11 that is filled with the reflective material, without significant increase of production steps.

Third Embodiment

Figure 23:
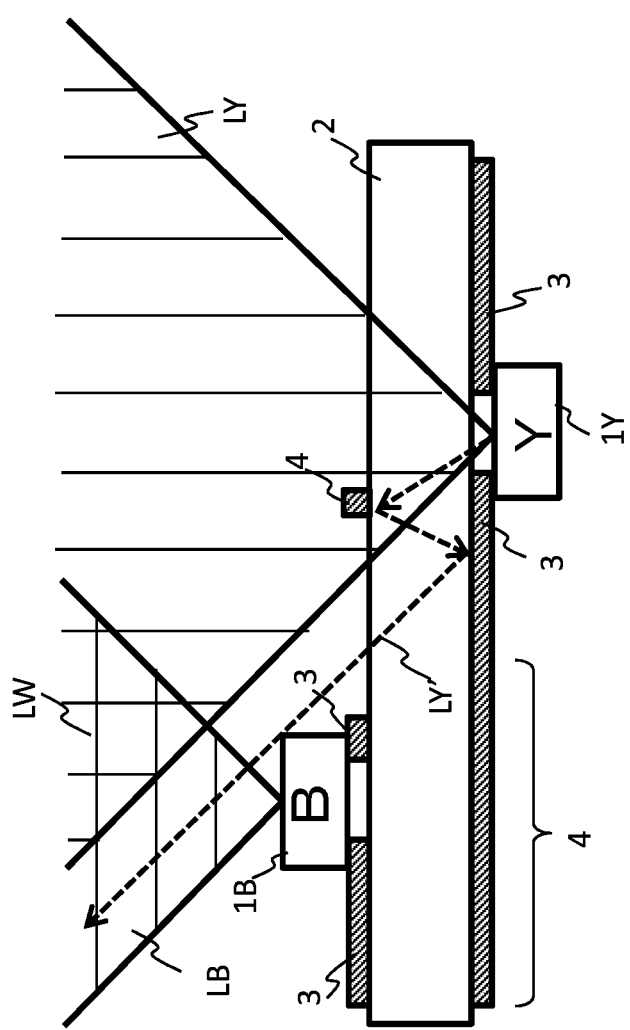
FIG. 23 is a partial cross-sectional view of still another example of the optically transparent plate with the light emitting function according to the third embodiment.

With reference to FIGS. 21 to 23, the optically transparent plate with the light emitting function according to a third embodiment will be described.

As described in the first embodiment with reference to FIGS. 3 to 6, the optically transparent plate provided with the reflective layer 4 of the present embodiment is allowed to improve color mixture properties when multiple LED dies 1 are mounted, each having different wavelengths of emitted light. In the third embodiment, there will be described another configuration of the optically transparent plate with improved color mixture properties.

Figure 21A:
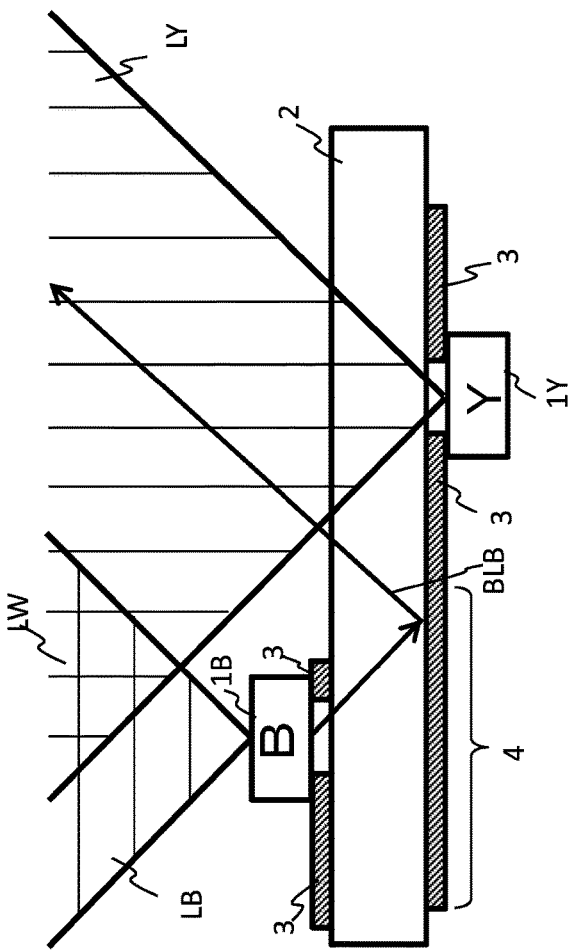
FIG. 21A is a partial cross-sectional view of the optically transparent plate with the light emitting function according to a third embodiment.

FIG. 21A is a partial cross-sectional view showing the optically transparent plate with the light emitting function according to the third embodiment, and it has a similar configuration as the optically transparent plate according to the first embodiment as shown in FIG. 5. However, in the third embodiment, the reflective layer 4 placed on the underside of the optically transparent substrate 2 is coupled with the wiring pattern 3 for the LED die 1Y that is placed on the underside, whereby the reflective layer 4 and the wiring pattern 3 share the functions with each other, serving a function of wiring and serving a function of the reflective layer.

The LED die 1B placed on the upper side of the optically transparent substrate 2 emits blue light, and the LED die 1Y placed on the underside thereof emits yellow light. The other configurations are similar to those of the first embodiment as shown in FIG. 5.

As described above, the reflective layer 4 and the wiring pattern 3 on the underside of the optically transparent substrate 2 are coupled, and the area covered by both the reflective layer 4 and the wiring pattern 3 becomes large on the underside of the optically transparent substrate 2. Therefore, the reflective layer 4 and the wiring pattern 3 on the underside of the optically transparent substrate 2 allow the blue light emission directed downward from the LED die 1B on the upper side, to be reflected upward. Accordingly, the color mixture properties of the blue light and the yellow light can be enhanced, the blue light emitted from the LED die 1B mounted on the upper side of the optically transparent substrate 2, and the yellow light emitted from the LED die 1Y on the underside.

Figure 21B:
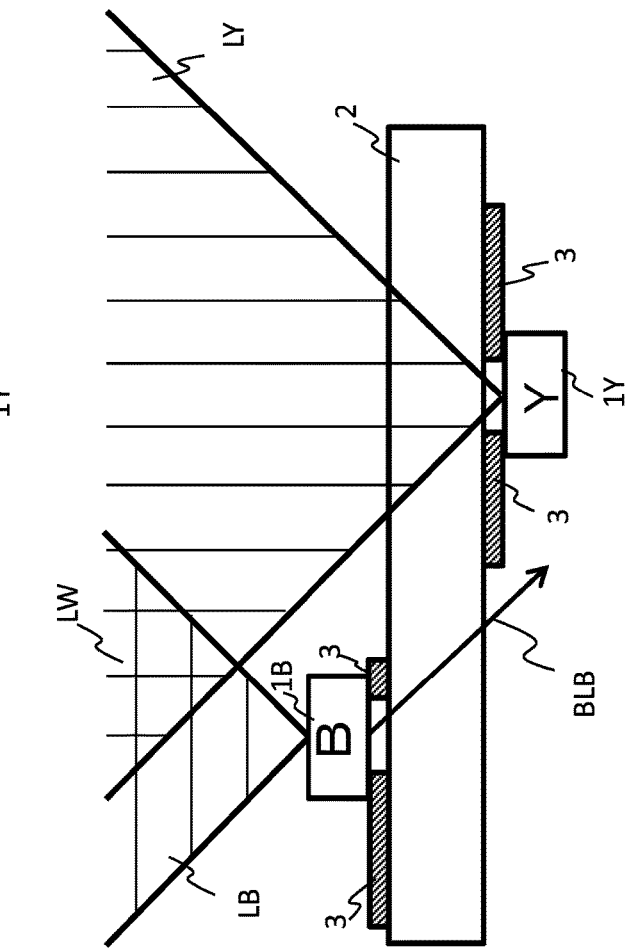
FIG. 21B is a partial cross-sectional view of the optically transparent plate as a comparative example.

There will be described further, the optically transparent plate of the third embodiment as shown in FIG. 21A, in comparison to an example of the optically transparent plate that is not provided with the reflective layer 4 as shown in FIG. 21B.

Generally, light intensity from the LED dies 1B and 1Y, is high at the center (in the direction approximately vertical with respect to the light emitting surface), and becomes smaller as approaching the periphery. A region within an angle range where more than a certain amount of light is emitted from each of the LED dies 1B and 1Y, is referred to as a region LB for the LED die 1B that emits blue light, and referred to as a region LY for the LED die 1Y that emits yellow light. As shown in the comparative example of FIG. 21B, if the reflective layer 4 is not placed, white light in a desired chromaticity range can be obtained by appropriately mixing blue light and yellow light in a region LW where the region LB overlaps the region LY. On the other hand, in the surrounding of the region LW, light intensity of either the blue light or the yellow light may become more intensive, and the white light in the desired chromaticity range is hardly obtained.

In this situation, when the reflective layer 4 and the wiring pattern 3 being coupled with each other are provided on the underside of the optically transparent substrate 2, like the optically transparent plate of the third embodiment as shown in FIG. 21A, a part of the blue light emitted from the bottom of the LED die 1B is reflected by a contact surface (interface) between the optically transparent substrate 2, and the reflective layer 4 and the wiring pattern 3, allowing the blue light emission to be discharged upward. With this configuration, a part of the blue light BLB is emitted into the region LY where yellow light is emitted, located out of the region LW where the blue light is emitted in the comparative example of FIG. 21B. With this configuration according to the present embodiment as shown in FIG. 21A, the blue light is allowed to reach the range LY, unlike the comparative example (FIG. 21B), and the white light in the desired chromaticity range can be obtained.

In the case where a flexible substrate is used as the optically transparent substrate 2, the contact surface between the optically transparent substrate 2 and the wiring pattern 3 is allowed to bend, along with bending the optically transparent substrate 2. Therefore, an effect of enhancing the color mixture properties is also achieved, even in the case where the optically transparent substrate 2 is bent.

When light is incident on and outgoing from the optically transparent substrate 2, refraction of light may occur, or interface reflection may occur on the optically transparent substrate 2, to be exact. It should be noted, however, such phenomena are not shown in FIGS. 21A and 21B.

FIG. 22A shows another example of the optically transparent plate according to the third embodiment, and both the LED die 1B and the LED die 1Y are arranged on the upper side of the optically transparent substrate 2. The reflective layers 4 are placed on the underside of the optically transparent substrate 2, respectively below the regions where the LED dies 1B and 1Y are mounted, and those reflective layers 4 are coupled together.

In the optically transparent plate as shown in FIG. 22A, a part of both the light BLB emitted from the bottom of the LED die 1B and a part of the light BLY emitted from the bottom of the LED die 1Y are reflected on the contact surface between the optically transparent substrate 2 and the reflective layer 4, and they are emitted upward. With this configuration, when the configuration of FIG. 22A of the present embodiment is compared with the configuration of FIG. 22B which is a comparative example where the reflective layer is not placed, it is found that in the configuration of FIG. 22A of the present embodiment, blue light is allowed to reach the range where the blue light fails to reach in the comparative example (FIG. 22B). In addition, it is also found that in the configuration of FIG. 22A of the present embodiment, yellow light is allowed to reach the range where the yellow light fails to reach in the comparative example (FIG. 22B). Accordingly, in the configuration as shown in FIG. 22A, white light in a desired chromaticity can be obtained.

FIG. 23 shows still another example of the optically transparent plate according to the third embodiment, where a small reflecting layer 4 is placed on the upper side of the optically transparent substrate 2, for reflecting a part of the outgoing beam LY from the LED die 1Y on the underside, in the configuration of the optically transparent plate as shown in FIG. 21A. With this configuration, as shown in FIG. 23, a part of the yellow light LY emitted from the LED die 1Y is reflected by the contact surface between the optically transparent substrate 2 and the upper-side reflective layer 4, and further reflected by the contact surface between the optically transparent substrate 2 and the reflective layer 4 on the underside, whereby the light is discharged upward. Accordingly, in addition to the effect of FIG. 21A, it is possible to produce another effect of obtaining white light in a desired chromaticity range, because the yellow light LY reaches the region LB in the configuration of FIG. 23, unlike the configuration of FIG. 21A where the yellow light fails to reach the region LB.

As described above, according to the optically transparent plate of the third embodiment, the region where white light is obtained in the desired chromaticity range can be enlarged, relative to the region of the conventional example, whereby the color mixture properties can be improved.

Fourth Embodiment

As illustrated by the cross sectional view of FIG. 24A and the top view of FIG. 24B, the optically transparent plate with the light emitting function according to a fourth embodiment comprises a first optically transparent substrate 21, a wiring pattern 3 placed on a surface on the upper side of the optically transparent substrate 21, an LED die 1 bonded to the wiring pattern 3, a second optically transparent substrate 22 placed on the other side, of the surface of the optically transparent substrate 21 on which the LED die 1 is mounted, and a reflective layer 4 placed between the optically transparent substrate 21 and the optically transparent substrate 22. Both at least a part of the wiring pattern 3 and at least a part of the reflective layer 4 comprise a conductive material obtained by sintering conductive particles. An upper surface of the reflective layer 4 is directly bonded to the optically transparent substrate 21, and a lower surface of the reflective layer 4 is directly bonded to the optically transparent substrate 22, whereby the optically transparent substrate 22 is fixed to the optically transparent substrate 21 via the reflective layer 4.

With this configuration, the optically transparent plate with the light emitting function according to the fourth embodiment is allowed to improve the light extraction efficiency, even with the structure where the LED die 1 is directly mounted on the optically transparent substrate 21.

Since the reflective layer 4 is directly bonded to the optically transparent substrates 21 and 22, it also serves as an adhesive layer for bonding those substrates together. Therefore, it is not necessary to prepare separately another adhesive layer for bonding the reflective layer 4 to the optically transparent substrates 21 and 22. This configuration allows provision of a thinner optically transparent plate than the plate with the reflective layer 4 adhered between the optically transparent substrates 21 and 22 via the adhesive layer. In addition, with this configuration, the optically transparent plate of multilayer structure that is thinner than a conventional plate can be provided, enabling the optically transparent plate of multilayer structure to be mounted on any desired wiring.

Furthermore, since the reflective layer 4 is directly bonded to the optically transparent substrates 21 and 22, the reflective layer 4 receives from the optically transparent substrate 21, heat generated upon light emission from the LED die 1, and efficiently conducts the heat to the optically transparent substrate 22, allowing the heat to be dissipated therefrom. Accordingly, this may improve thermal dissipation of the LED die 1.

In addition, since both sides of the reflective layer reflective layer 4 are bonded respectively to the optically transparent substrates 21 and 22, being placed therebetween, the reflective layer reflective layer 4 has less exposed part, relative to the case where it is not placed between those substrates. Accordingly, this configuration may improve the corrosion resistance of the reflective layer reflective layer 4.

In the present embodiment, the reflective layer reflective layer 4 is placed on the underside of the optically transparent substrate 21, below a region where the LED die 1 is mounted. As shown in FIG. 24A, this configuration allows some light emission directed downward, as a part of the light emitted from the LED die 1, to be reflected upward by the reflective layer 4. On the other hand, when the reflective layer 4 is not placed, even though the light emitted from the LED die 1 directed to the upper side and to the lateral side, is made to discharge upward, the light emitted from the bottom of the LED die 1 fails to be discharged upward. Accordingly, with the reflective layer 4 being arranged as described above, the light extraction efficiently can be improved in the upper part of the light emitted from the LED die 1, relative to the case where the reflective layer 4 is not provided. When light is incident on and outgoing from the optically transparent substrates 21 and 22, refraction of light may occur, or interface reflection may occur on the optically transparent substrates 21 and 22, to be exact. It should be noted, however, such phenomena are not shown in FIGS. 24A and 24B.

When multiple LED dies 1 are placed, the position or the width of the reflective layer 4 may be changed, depending on the position of each LED die 1, thereby enabling modification of a mixture range of the light that is emitted from each LED die 1.

<Method of Producing the Optically Transparent Plate with the Light Emitting Function According to the Fourth Embodiment>

With reference to FIGS. 25A to 25F, a method of producing the optically transparent plate with the light emitting function according to the fourth embodiment will now be described. In here, there will be described an example where the wiring pattern 3 is obtained by sintering ink that contains conductive particles, with a solvent and a dispersant, by using light being electromagnetic waves.

Figure 25E:
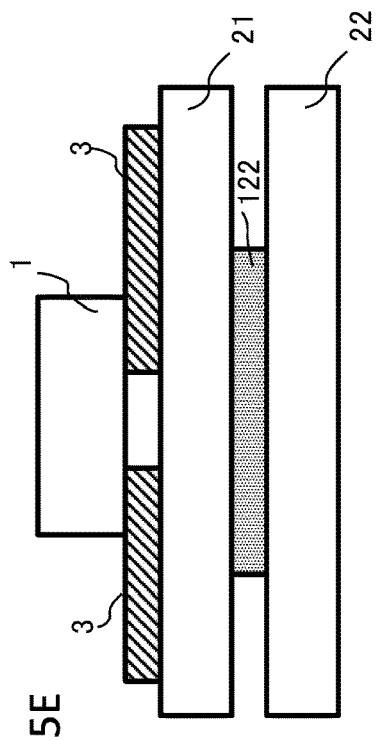
FIGS. 25A to 25F illustrate a method of producing the optically transparent plate with the light emitting function according to the fourth embodiment.
Figure 25F:
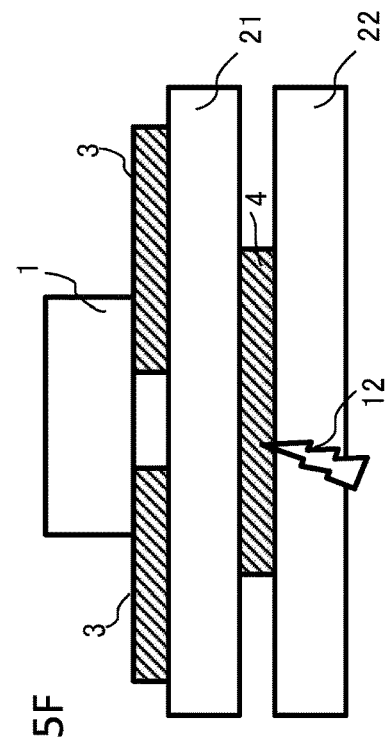
Figure 25A:
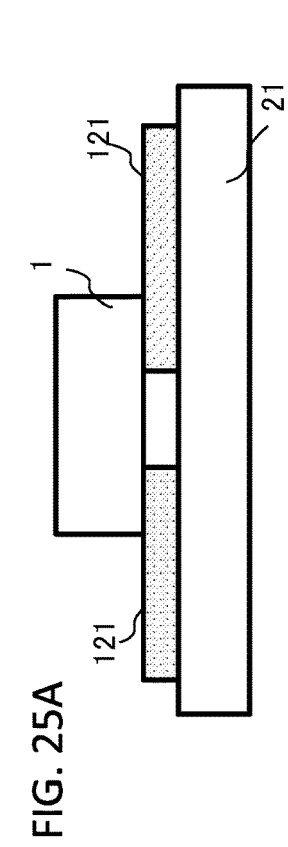

As illustrated in FIG. 25A, solution (ink) where conductive particles are dispersed is prepared, and it is applied to the upper surface of the optically transparent substrate 21, in a desired form. Then, a film 121 of conductive particles is formed on the upper surface of the optically transparent substrate 21.

Figure 25B:
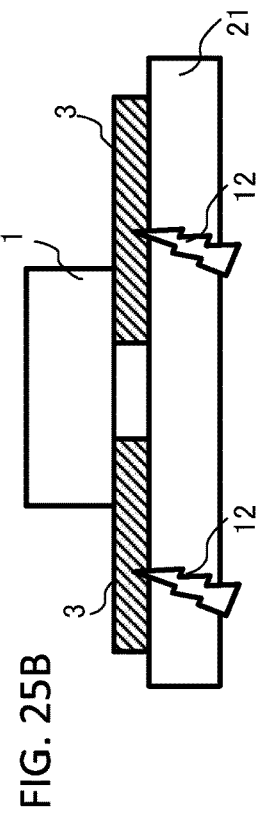

In order to sinter fine particles in the unsintered film 121 being formed, only the wiring part is locally heated by irradiation of electromagnetic waves or light, for instance, and the conductive particles undergo sintering. As a specific example, firstly, the LED die 1 is mounted on the unsintered wiring pattern 3, in a manner that electrodes (not shown) of the LED die 1 are brought into contact with the film 121. Next, as shown in FIG. 25B, the film 121 is irradiated with the light beam 12, through the optically transparent substrate 21, from the underside thereof.

Figure 25C:
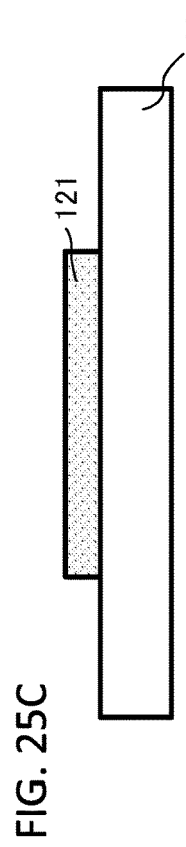

Subsequently, as shown in FIG. 25C, the optically transparent substrate 22 is prepared, and solution (ink) or a similar solvent where conductive particles are dispersed is applied to the upper surface of the optically transparent substrate 22, in the form of the reflective layer 4, thereby forming the unsintered film 121. The solution and the application method are the same as those in the step of FIG. 25A.

Figure 25D:
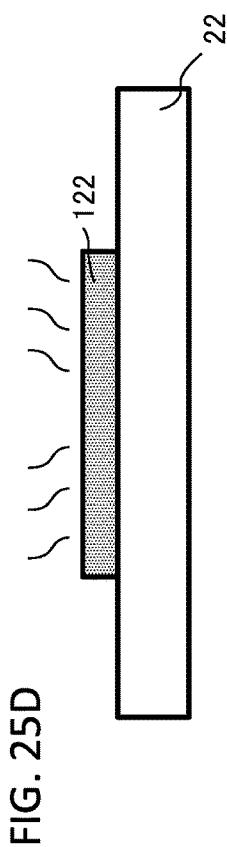

Then, as shown in FIG. 25D, the solution constituting the film 121 applied to the optically transparent substrate 22 is condensed, and a condensed film 122 is formed. Specifically, the optically transparent substrate 22 where thus applied unsintered film 121 is formed, is heated by a heater such as an oven, and a solvent component of the film 121 is partially evaporated, thereby forming the film 122 containing a higher concentration of conductive particles, relative to the ink. This heating temperature may be set lower than the boiling point of the solvent, and preferably, at the temperature (approximately between or equal to 60° C. and 250° C., though the range may differ depending on the solvent) to the extent that a certain viscosity remains on the upper surface of the film 122, without developing bubbles in the solvent due to heating. With evaporating the solvent component of the film 121, a concentration of the ink becomes higher, facilitating bonding of the film 122 to the optically transparent film 21.

Next, as shown in FIG. 25E, the optically transparent substrate 21 with the LED die 1 mounted thereon is adhered to the upper surface of the film 122, placing the film 122 between the lower surface of the optically transparent substrate 21 and the upper surface of the optically transparent substrate 22.

It is to be noted that the step of condensing the solution constituting the film 121 as shown in FIG. 25D may be performed subsequent to the step of FIG. 25E for placing the film 121 between the optically transparent substrates 21 and 22. However, it is more preferable to perform the step of FIG. 25D in advance, because the area of exposure of the film 121 is larger before its upper surface is adhered to the optically transparent substrate 21 and the solution is allowed to evaporate more easily. In addition, if the concentration of the ink is high enough to allow the reflective layer 4 to be bonded to the optically transparent substrates 21 and 22, without evaporating the solvent of the ink, the step of evaporating the solvent can be omitted.

Finally, as shown in FIG. 25F, the film 122 is irradiated with the light beam 12 through the optically transparent substrate 22, from the underside thereof, and the film 122 undergoes sintering. According to this processing, the reflective layer 4 is formed, and simultaneously, the interfaces are melted between the reflective layer 4 and each of the optically transparent substrates 21 and 22, thereby allowing the reflective layer 4 to be directly bonded to the optically transparent substrates 21 and 22. Specifically, the upper surface of the reflective layer 4 is directly bonded to the optically transparent substrate 21, and the lower surface of the reflective layer 4 is directly bonded to the optically transparent substrate 22. According to the steps as described above, the optically transparent plate with the light emitting function is produced.

As discussed so far, the method of producing the optically transparent plate with the light emitting function of the fourth embodiment does not need a step of providing an adhesive layer for adhering the reflective layer 4 to the optically transparent substrates 21 and 22. Therefore, it is possible to reduce the number of man-hours, relative to the production of the optically transparent plate that requires the adhesive layer. This method where the adhesive layer is not necessary may also eliminate the need of heat, ultraviolet light, or the like, and materials constituting the adhesive layer, and thus this brings about cost reduction.

Further in this method, only by increasing the concentration of the conductive particles by heating, relative to the ink, the optically transparent plate thinner than conventional one can be provided, and accordingly, this method facilitates producing the optically transparent plate being thin. In addition, another reflective layer or optically transparent substrate may be laminated on the underside of the optically transparent substrate 22, and the optically transparent plate with multi-laminated optically transparent substrates may be produced easily.

In the present embodiment, there has been described an example where the condensed film 122 is formed on the upper surface of the optically transparent substrate 22, and then the reflective layer 4 is formed. However, it is also possible that the film 122 is formed firstly on the lower surface of the optically transparent substrate 21, followed by placing the film 122 between the optically transparent substrates 21 and 22, and then the reflective layer 4 is formed.

In the step of FIG. 25B, the light beam 12 applied to the film 121, may be adjusted in advance to the shape of the wiring pattern 3, via passing through a mask. Alternatively, the light beam 12 with an irradiation spot in a circular shape or a rectangular shape is made to scan, so as to depict the wiring pattern 3. The method of bonding the wiring pattern 3 to the optically transparent substrate 21 may be carried out, by heating the optically transparent substrate 21 with the LED die 1 mounted thereon, allowing the solvent in the film 121 to evaporate, and then sintering the film 121, similar to the method of bonding the reflective layer 4 to the optically transparent substrates 21 and 22.

Fifth Embodiment

Figure 26A:
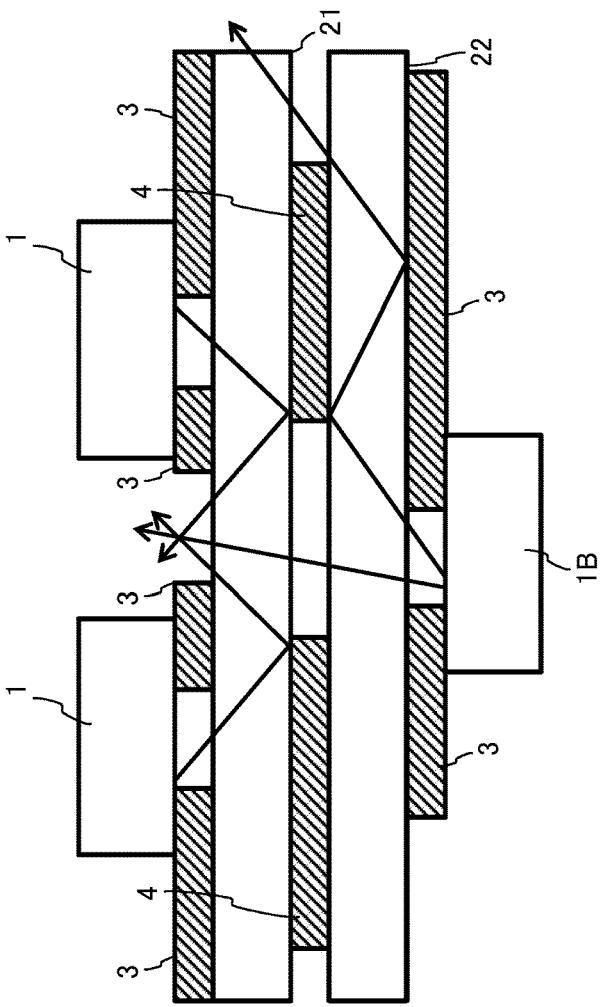
FIG. 26A is a partial cross-sectional view of the optically transparent plate with the light emitting function according to a fifth embodiment.
Figure 26B:
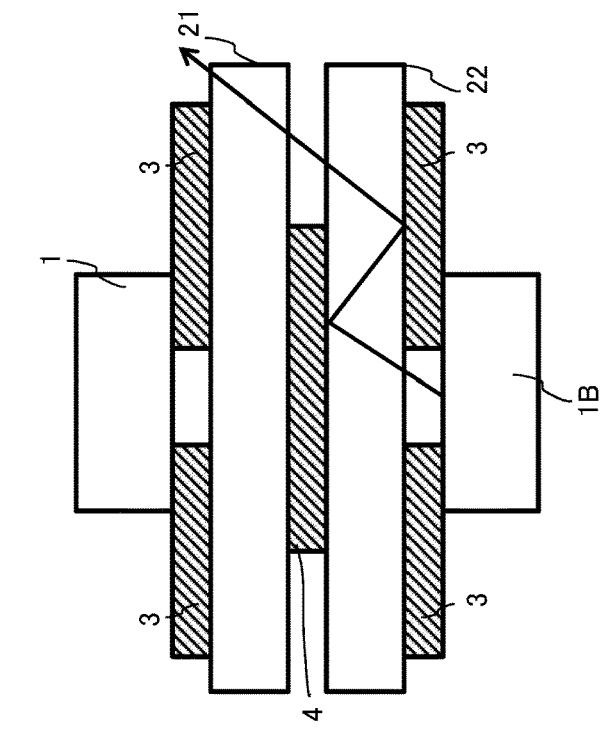
FIG. 26B is a partial cross-sectional view showing another example of the optically transparent plate with the light emitting function according to the fifth embodiment.

With reference to FIGS. 26A and 26B, the optically transparent plate with the light emitting function according to a fifth embodiment will now be described.

The optically transparent plate with the light emitting function of the fifth embodiment is provided with an LED die 1B also on the underside of the optically transparent substrate 22. In this case, the wiring pattern 3 is provided also on the underside of the optically transparent substrate 22, and the LED die 1B is bonded to the wiring pattern 3 on the underside of the optically transparent substrate 22.

The wiring pattern 3 on the upper side of the optically transparent substrate 21 and the wiring pattern 3 on the underside of the optically transparent substrate 22 may also serve as the reflective layer. Furthermore, as shown in FIG. 26B, multiple LED dies 1 may be mounted on the upper surface of the first optically transparent substrate 21.

As shown in FIGS. 26A and 26B, a part of the light emitted from the bottom of the LED die 1 is reflected on the contact surface (interface) between the optically transparent substrate 22 and the wiring pattern 3, or on the contact surface (interface) between the optically transparent substrate 21 and the reflective layer 4, and then emitted toward the upper side. In addition, the reflective layer 4 reflects the light emitted upward from the LED die 1B, and thus reflected light is further reflected by the wiring pattern 3 on the underside of the optically transparent substrate 22, and then the light is emitted upward.

As thus described, the reflective layer 4 is arranged so that the light emitted from the LED die 1B is directed upward (to the optically transparent substrate 21 side), whereby it is possible to provide the optically transparent plate that emits light upward, from both the LED die 1 mounted on the upper side of the optically transparent substrate 21, and the LED die 1B mounted on the underside of the optically transparent substrate 22.

When multiple LED dies 1 are mounted on the upper side of the first optically transparent substrate 21, it is preferable that the reflective layers 4 should be arranged on the underside of the optically transparent substrate 21, respectively below the regions where the LED dies 1 are mounted. Though not illustrated, another reflective layer 4 may be placed additionally on the upper side of the optically transparent substrate 22 (between the optically transparent substrates 21 and 22) in the region above the LED die 1B mounted on the underside, and those reflective layers 4 may be coupled to one another.

With the reflective layers 4 being coupled, the area where the reflective layer 4 covers the underside of the optically transparent substrate 21 is enlarged, whereby the amount of the light reflected upward by the reflective layer 4 and the wiring pattern 3 is increased, out of the light emission directed downward from the LED die 1.

The light emitted from the LED die 1B may also be directed downward (to the opposite side of the optically transparent substrate 21), thereby enabling provision of the optically transparent plate that emits lights from both sides, i.e., the upper side and the underside of the optically transparent substrates 21 and 22.

In the case where flexible substrates are employed as the optically transparent substrates 21 and 22, the contact surfaces between each of the optically transparent substrates 21 and 22 and the wiring pattern 3 are bent, following bending of those optically transparent substrates. Therefore, even when the optically transparent substrates 21 and 22 are bent, an effect for improving the color mixture properties can be produced.

Sixth Embodiment

Figure 27B:
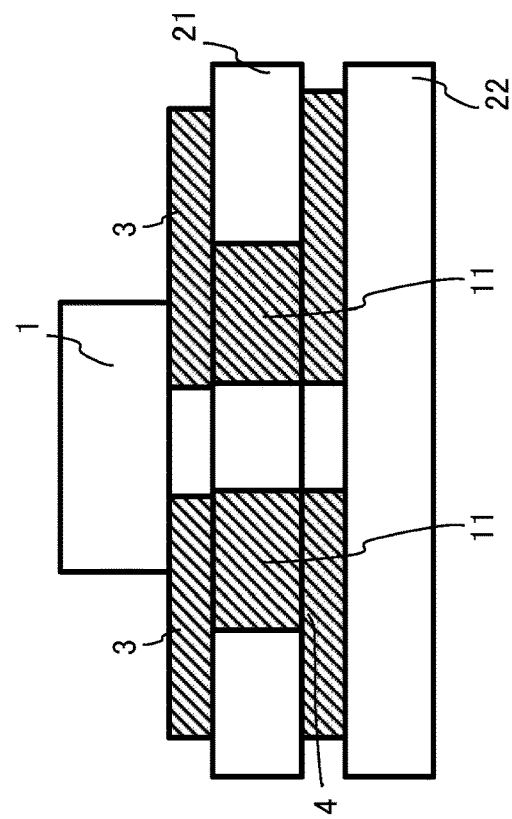
FIG. 27B is a partial cross-sectional view showing another example of the optically transparent plate with the light emitting function according to the sixth embodiment.
Figure 27A:
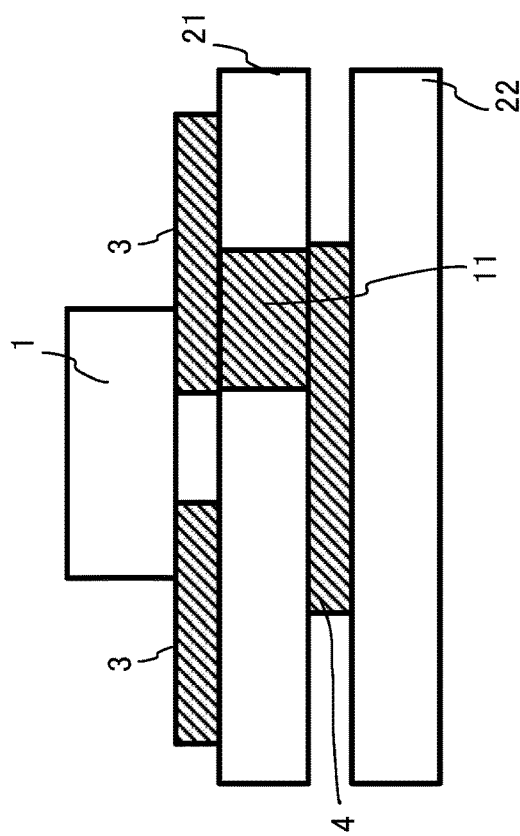
FIG. 27A is a partial cross-sectional view of the optically transparent plate with the light emitting function according to a sixth embodiment.

With reference to FIGS. 27A and 27B, the optically transparent plate with the light emitting function according to a sixth embodiment will be described.

In the sixth embodiment, the optically transparent substrate 21 is provided with a notch 11 in the thickness direction of the substrate in the vicinity of the LED die 1, and the notch 11 is filled with a reflective material.

Even though a part of the light emitted from the LED die 1 penetrates in the optically transparent substrate 21, and then travels in the inner-plane direction of the optically transparent substrate 21, thus provided notch 11 filled with the reflective material allows the light to be reflected upward. Therefore, light extraction efficiently in the upper part of the LED die 1 can be improved, together with preventing conduction of light into the inner-plane direction of the optically transparent substrate 21.

One notch 11 may be provided as shown in FIG. 27A, or more than one notch, e.g., two notches, may be provided as shown in FIG. 27B. Alternatively, the notch 11 may also be provided in the optically transparent substrate 22, being filled with the reflective material. The notch 11 may be inclined with respect to the upper surface of the optically transparent substrate 21, and adjustment of the tilt angle may control the direction of the reflected light after passing through the optically transparent substrate 21 and reaching the reflective material in the notch 11.

Preferably, a region on the lower surface of the optically transparent substrate 21 below the region surrounded by the notch 11 should be covered with the reflective layer 4. This configuration allows the light reflected by the reflective material filled in the notch 11 and reaching the lower surface of the optically transparent substrate 21 to be reflected upward by the reflective layer 4. Therefore, the light extraction efficiency in the upper part can be improved more.

<Method of Producing the Optically Transparent Plate with the Light Emitting Function According to the Sixth Embodiment>

Next, there will be described a method of producing the optically transparent plate with the light emitting function according to the sixth embodiment. In here, an example of the method for producing the optically transparent plate as shown in FIGS. 28A to 28G will now be described, where the wiring pattern 3 is obtained by sintering ink with the use of light, which is electromagnetic waves, the ink containing conductive particles together with a solvent and a dispersing agent.

Initially, as shown in FIG. 28A, the optically transparent substrate 21 is prepared, and two notches 11 are formed.

Forming the notch 11 by laser processing may have the characteristics that the diameter of the notch on the laser incident side becomes larger than the diameter of the notch on the laser outgoing side. Therefore, when the notch 11 is to be inclined with respect to the upper surface of the optically transparent substrate 21, those characteristics can be utilized, so as to easily incline the side surfaces of the notch 11.

Next, in the step of FIG. 28B, similar to the step of the fourth embodiment as shown in FIG. 25A, ink with the conductive particles dispersed therein is applied to the upper surface of the optically transparent substrate 21, or a similar process is performed, and uncured film 121 supposed to become the wiring pattern 3 is formed, together with filling the ink in the notch 11 to form an uncured filling part 123. Then, the LED die 1 is mounted on the film 121.

Next, in the step of FIG. 28C, similar to the step of the fourth embodiment as shown in FIG. 25B, the film 121 is irradiated with the light beam 12 for sintering the conductive particles so as to form the wiring pattern 3, along with bonding the wiring pattern 3 to the LED die 1, and simultaneously, the filling part 123 is also irradiated with the light beam for sintering the conductive particles so as to form the reflective material. The film 121 and the filling part 123 may be irradiated with the light beam 12, simultaneously or at different times.

The steps of FIGS. 28D to 28G are the same as the steps of FIGS. 25C to 25F.

The order of the steps for forming the notch is not limited to the aforementioned example. The notch 11 may be formed after the LED die 1 is mounted on the film 121. Alternatively, the notch 11 may be formed prior to forming the wiring pattern 3, or subsequent thereto. The notch 11 may be formed, prior to forming the uncured film 121 supposed to be the wiring pattern 3 or forming the uncured film 121 supposed to be the reflective layer 4. Filling the notch 11 with the ink with the conductive particles dispersed therein may be performed simultaneously with forming the uncured film 121 supposed to be the wiring pattern 3 or the uncured film 121 supposed to be the reflective layer 4, or performed at different times. It is of course possible that the conductive-particle dispersed ink undergoes sintering individually, in the uncured film 121 supposed to be the wiring pattern 3, in the uncured film 121 supposed to be the reflective layer 4, and in the notch 11. Alternatively, with a structure of collective light irradiation, they may be irradiated with light simultaneously, and sintered in one operation. Since the conductive-particle dispersed ink that undergoes sintering within the notch 11 has conductivity, it may also be used as a via-hole.

In the production steps as shown in FIGS. 28A to 28G, the wiring pattern 3 and the reflective material in the notch 11 can be sintered simultaneously. Therefore, this allows production of the optically transparent plate with the notch 11 filled with the reflective material, without drastically increasing the number of steps relative to the steps in FIGS. 25A to 25F.

Seventh Embodiment

Figure 29A:
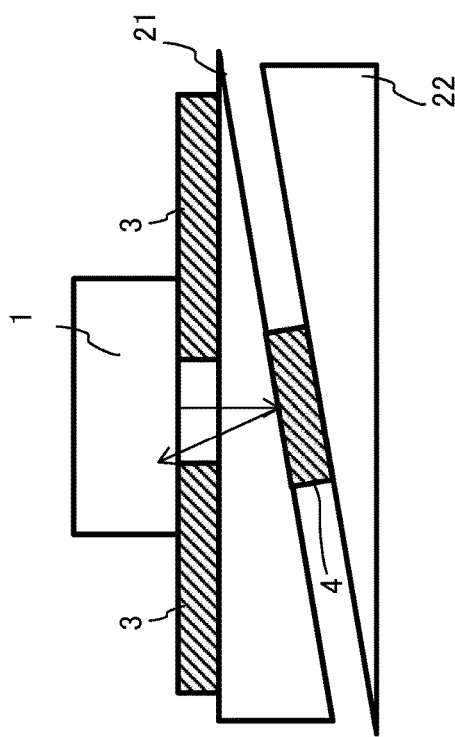
FIG. 29A is a partial cross-sectional view of the optically transparent plate with the light emitting function according to a seventh embodiment.
Figure 29B:
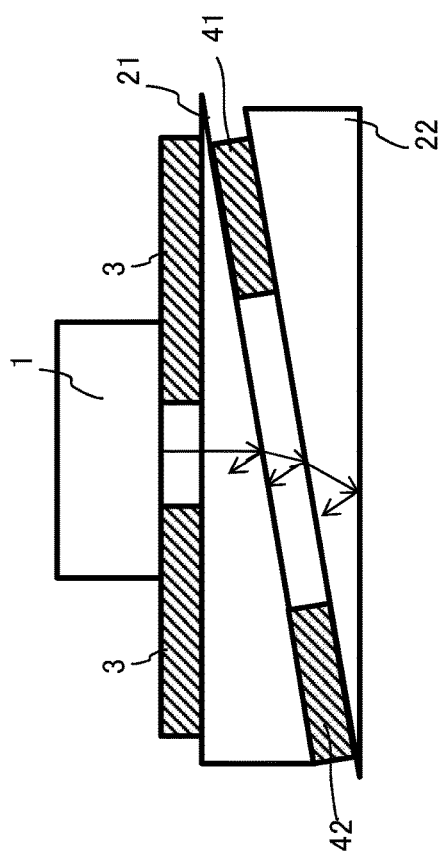
FIGS. 29B and 29C are partial cross-sectional views showing another examples of the optically transparent plate with the light emitting function according to the seventh embodiment.
Figure 29C:
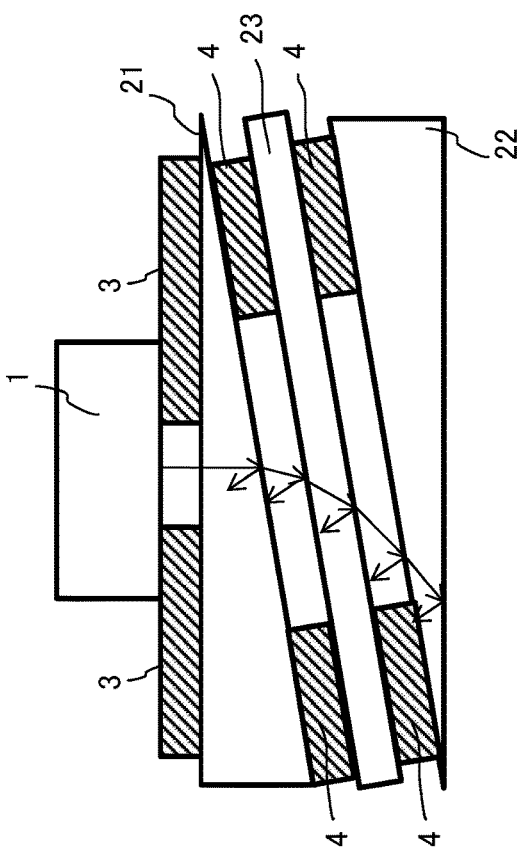

With reference to FIGS. 29A to 29C, the optically transparent plate with the light transmitting function according to a seventh embodiment will be described.

As shown in FIG. 29A, in the seventh embodiment, neither the optically transparent substrate 21 nor the optically transparent substrate 22 is uniform in thickness. Specifically, the optically transparent substrate 21 is a member with an inclined lower surface with respect to the upper surface, so that both ends thereof are different in thickness. As for the optically transparent substrate 22, it is a member with an inclined upper surface with respect to the lower surface, so that both ends thereof are different in thickness. Those two substrates are placed in a manner that the thin end of the optically transparent substrate 21 is made to face the thick end of the optically transparent substrate 22, and the thick end of the optically transparent substrate 21 is made to face the thin end of the optically transparent substrate 22.

There may be provided multiple reflective layers between the optically transparent substrate 21 and the optically transparent substrate 22. The first reflective layer 41 is placed in the vicinity of the thin end of the optically transparent substrate 21 and the thick end of the optically transparent substrate 22, and the second reflective layer 42 is placed in vicinity of the thick end of the optically transparent substrate 21 and the thin end of the optically transparent substrate 22. As shown in FIG. 29B, the reflective layer 4 may be provided on the underside of the optically transparent substrate 21, below the region where the LED die 1 is mounted. In addition to the first reflective layer 41 and the second reflective layer 42 being placed, the reflective layer 4 may also be provided on the underside of the optically transparent substrate 21, below the region where the LED die 1 is mounted. Furthermore, those reflective layers placed between the optically transparent substrates 21 and 22 may be coupled to one another.

The optically transparent plate as shown in FIG. 29C is a modification example of the optically transparent plate of the seventh embodiment, and the optically transparent substrate 23 in a uniform thickness is placed between the optically transparent substrate 21 with the inclined lower surface and the optically transparent substrate 22 with the inclined upper surface. Furthermore, in this optically transparent plate, the reflective layer 4 is placed between the lower surface of the optically transparent substrate 21 and the upper surface of the optically transparent substrate 23, and in addition, another reflective layer 4 is placed between the lower surface of the optically transparent substrate 23 and the upper surface of the optically transparent substrate 22.

As described so far, by arranging a combination of the optically transparent substrates, with the inclined upper surface or with the inclined lower surface, the upper surface of the reflective layer 4 can be placed, being inclined with respect to the bottom of the LED die 1. Therefore, in the optically transparent plate of the seventh embodiment, the reflective layer 4 allows the light to be reflected in the direction different from the direction of the reflected light in the optically transparent plate that includes uniform optically transparent substrates 21 and 22 as described in the fourth embodiment. As discussed so far, variation of the inclination of the upper surface or the lower surface of the optically transparent substrate enables controlling of the direction of the light emitted from the bottom of the LED die 1 and reflected by the reflective layer 4.

As shown in FIGS. 29A and 29C, when the reflective layer 4 is not placed in the underside of the optically transparent substrate 21, below the region where the LED die 1 mounted, there are layers of air, respectively, between the optically transparent substrate 21 and the optically transparent substrate 22, between the optically transparent substrate 21 and the optically transparent substrate 23, and between the optically transparent substrate 23 and the optically transparent substrate 22. Due to a refractive index difference between the air and the optically transparent substrates 21, 22, and 23, a part of the light emitted from the LED die 1 is reflected, and the remaining light is refracted and pass through the substrates, according to the inclined lower surface of the optically transparent substrate 21, the upper surface of the optically transparent substrate 23, the lower surface of the optically transparent substrate 23, the inclined upper surface of the optically transparent substrate 22, and the lower surface of the optically transparent substrate 22. With this configuration, the light is reflected upward, from the points displaced laterally, respectively on a plurality of reflecting surfaces. Accordingly, this makes the light emitted from just one LED die 1 appear to be the light emitted from multiple light sources.

There will now be described materials, sintering methods, and variations that are employed for the optically transparent plate according to the fourth to the seventh embodiments. In addition to those as described below, materials, sintering methods, and others as described in the first to the third embodiments may also be applicable.

<Materials of Each Member>

There will now be described materials of the members used for the optically transparent plate according to the fourth to the seventh embodiments.

Figure 30B:
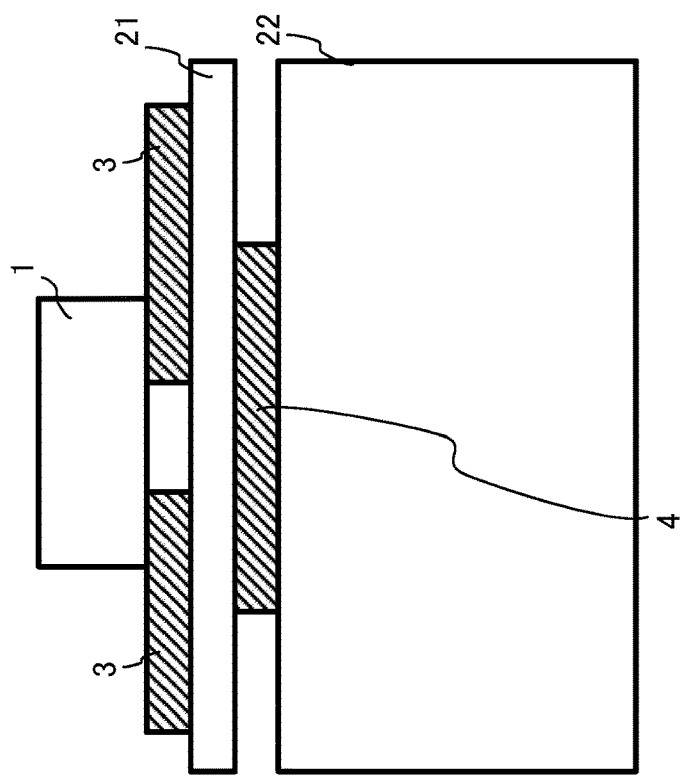
FIGS. 30A and 30B are cross-sectional views showing another examples of the optically transparent plate with the light emitting function.
Figure 30A:
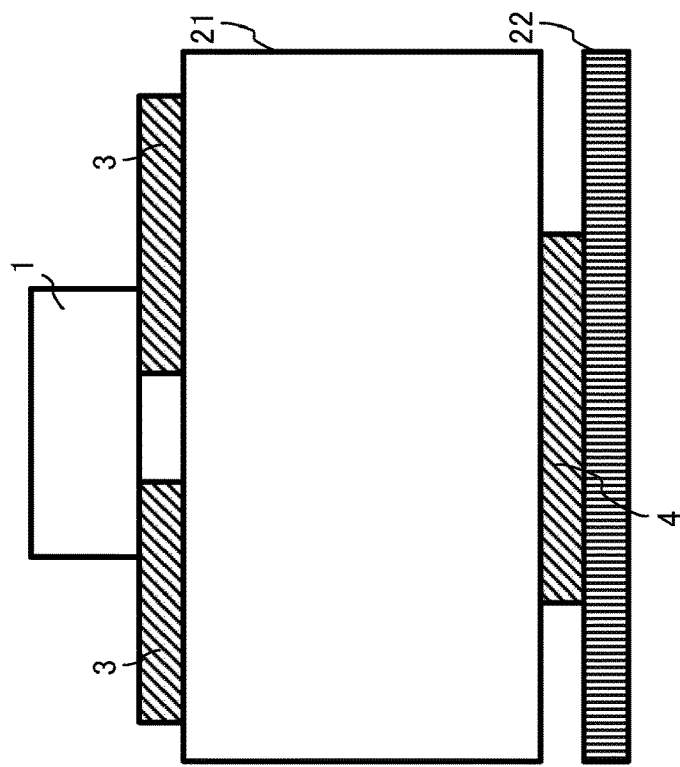

The thickness and materials may be the same between the optically transparent substrates 21 and 22, or they may be different as shown in FIGS. 30A and 30B. Using different organic materials or using combinations of various organic materials, respectively as the materials of the optically transparent substrates 21 and 22, may enable distinction of usage between those optically transparent substrates, such as usage for installation, and usage for reinforcements.

A substrate or a thin film of 1 μm or more in thickness may be employed as the optically transparent substrates 21 and 22. In the case where materials such as polyimide, polycarbonate, polyethylene terephthalate, and polyethylene naphthalate, are used as the optically transparent substrate, those materials contain less hydrophobic groups than other materials such as a silicone, and thus this may enhance bonding properties to the wiring pattern 3 and the reflective layer 4.

The optically transparent substrates 21 and 22 may comprise inorganic materials such as ceramics and glass, instead of resin. In the case where light is used as heating method for sintering the conductive particles, the optically transparent substrates 21 and 22 should be transparent allowing the wavelength of the light to pass through. However, if heating is performed without using light, the substrates are not necessarily transparent.

By way of example, the size of the wiring pattern 3 may be, approximately, 1 μm or more in width, and equal to or between 0.01 μm and 50 μm in thickness.

It is to be noted that the conductive material obtained by sintering the conductive particles constituting the reflective layer 4 may be the same as the conductive material obtained by sintering the conductive particles constituting the wiring pattern 3. A conductive material obtained by sintering identical conductive particles may be used for each of the multiple reflective layers 4 placed on the underside of the optically transparent substrate 21. Alternatively, various conductive materials may be used for those reflective layers. Change of a type and quantity of the conductive particles used for the wiring pattern 3 or the reflective layer 4 may enable provision of the optically transparent plate that has various reflective properties.

In particular, it is preferable that the ink for forming the reflective layer 4 should contain polyvinylpyrrolidone, since this facilitates bonding of the reflective layer 4 to the optically transparent substrates 21 and 22.

<Sintering>

For sintering the conductive particles constituting the wiring pattern 3 and the reflective layer 4, there has been described an example of electromagnetic sintering by irradiating the films 121 and 122 with the light beam 12. However, a method of sintering is not limited to this example. For example, the optically transparent substrates 21 and 22 with the films 121 and 122 formed thereon may be heated for sintering. On the other hand, according to the electromagnetic sintering, a temperature of the portion that undergoes sintering becomes high within a shorter time, relative to the sintering by applying heat to the substrates. Therefore, this facilitates melting of the interfaces of the optically transparent substrates 21 and 22 to which the films 121 and 122 are adhered respectively. Thus, the electromagnetic sintering can enhance the adhesion between the optically transparent substrates 21 and 22, via the reflective layer 4, relative to the sintering by applying heat to the substrates.

<Variations>

There will now be described various configurations that are applicable to the optically transparent plate according to each of the embodiments as has been discussed above.

The LED die 1 provided for the optically transparent plate according to each of the aforementioned embodiments may be bonded to the wiring pattern 3, via a conductive material obtained by sintering of conductive particles, for example.

As shown in FIG. 31A, a power source and electronic components 90 (hereinafter, referred to as electronic components and others 90) such as a resistance, capacitor, and IC, may be mounted on the upper surface of the optically transparent substrate 21, and the LED die 1 may be electrically connected to thus mounted electronic components and others 90 via the wiring pattern 3. In addition, as shown in FIG. 31B, multiple LED dies 1 may be placed on the upper side of the optically transparent substrate 21. Furthermore, the electronic components and others 90 may be placed on a second substrate, other than the substrate where the LED die 1 is placed.

Though not illustrated, a film (equal to or between 0.001 jam and 50 μm), which is thinner than the reflective layer 4, may be placed on the underside of the optically transparent substrate 22, thereby providing a film having characteristics of a half mirror. Furthermore, a color filter may be placed on at least a part of the optically transparent substrates 21 and 22. Change of arrangement of the half mirror and the color filter enables provision of the optically transparent plate having various reflection properties and transparency properties.

Furthermore, an optical transparent film, though not illustrated, for embedding the LED die 1 or the reflective layer 4 therein, may be placed on the upper surface of the optically transparent substrate 21, in the surrounding of the LED die 1, in the surrounding of the reflective layer 4, between the optically transparent substrates 21 and 22, and other positions. A refractive index difference between the LED die 1 and the optically transparent film is smaller than the refractive index difference between the LED die 1 and the air, and thus placement of the optically transparent film may further improve the light extraction efficiency from the LED die 1. In addition, the optically transparent film may be arranged in the surrounding of the reflective layer 4 placed between the optically transparent substrates 21 and 22, thereby further improving the corrosion resistance of the reflective layer 4. By employing the optically transparent film having barrier properties, this may improve corrosion resistance of the members, such as the LED die 1, the wiring pattern 3, and the reflective layer 4, when covered with the optically transparent film.

In the case where another optically transparent substrate is placed on the upper side of the optically transparent substrate 21, and the LED die 1 is placed between those optically transparent substrates, with providing the optically transparent film in the space between those substrates, or in the case where the optically transparent film is placed between the optically transparent substrates 21 and 22, the space between the two optically transparent substrates may be filled with resin according to a capillary phenomenon or vacuum injection techniques, followed by curing the resin according to a desired method.

The optically transparent plate as described in the first to the seventh embodiments is capable of switching between a transparent state and a light emitting state. Therefore, it is applicable to an automobile windshield and rear glasses, for example, and the plate is transparent in a normal state, whereas if necessary, displaying or illuminating can be performed by light emission. With this configuration, it is possible to achieve a structure such as a head-up display intended to offer a display on the windshield, and a predetermined display in an emergency on the rear glass to attract attention of a driver in a following vehicle.

In addition, the present invention is preferably applicable to lighting equipment (such as point emission/surface emission lighting, flexible lighting, and automotive lighting (interior, exterior), display equipment (such as a see-through display, a wearable display, a head-up display, and LCD backlight), showcasing equipment (such as showcasing illumination and display for a gaming machine (pachinko)), consumer electric appliances, communication equipment, and OA equipment.

What is claimed is:

1. An optically transparent plate with a light emitting function comprising: an optically transparent substrate; a plurality of wiring patterns; an LED die mounted on the optically transparent substrate; and a reflective layer; wherein: the optically transparent substrate has a shape of one flat plate formed of an optically transparent material, and has an upper surface and a lower surface; the LED die mounted on the optically transparent substrate has a bottom surface facing the upper surface of the optically transparent substrate, a top surface that is opposite the bottom surface, and side surfaces arranged between the bottom surface and the top surface, and the LED die emits light from an entire surface of the bottom surface, the upper surface, and the side surfaces; the plurality of wiring patterns are placed at least on the upper surface of the optically transparent substrate, and the LED die is electrically connected to the plurality of wiring patterns placed on the upper surface of the optically transparent substrate; a region with no wiring patterns is provided between the plurality of the wiring patterns electrically connected to the LED die, on the upper surface of the optically transparent substrate; the LED die is mounted on adjacent wiring patterns among the plurality of wiring patterns with the region interposed therebetween such that the LED die is placed on the adjacent wiring patterns across the region, and directly bonded to the wiring patterns; the reflective layer is formed on the lower surface of the optically transparent substrate, and a position of the reflective layer on the lower surface faces the LED die, including the region between the wiring patterns on the upper surface; both at least a part of the wiring patterns and at least a part of the reflective layer comprise a conductive material obtained by sintering conductive particles; the LED die, the wiring patterns, and the reflective layer are arranged so that external light penetrates areas between the LED die, the wiring patterns, and the reflective layer, on the optically transparent substrate when the LED die is not illuminated; the conductive particles include metal and form the reflective layer reflecting light; and the wiring patterns that are placed on the upper surface of the optically transparent substrate do not have any electrical connection with the reflective layer formed on the lower surface of the optically transparent substrate.

2. The optically transparent plate with the light emitting function according to claim 1, wherein the LED die is bonded to the wiring patterns via the conductive material obtained by sintering the conductive particles.

3. The optically transparent plate with the light emitting function according to claim 1, wherein the upper surface of the optically transparent substrate is covered with an optically transparent film that is placed in a manner that the LED die is embedded therein.

4. The optically transparent plate with the light emitting function according to claim 3, wherein a lens is placed on the upper surface of the optically transparent film, above a position of the LED die.

5. The optically transparent plate with the light emitting function according to claim 1, wherein the reflective layer is larger than the LED die.

6. The optically transparent plate with the light emitting function according to claim 5, wherein two or more LED dies are mounted on the upper surface of the optically transparent substrate.

7. The optically transparent plate with the light emitting function according to claim 1, wherein the optically transparent substrate is provided with a notch in the thickness direction thereof, in the vicinity of the LED die, and the notch is filled with a reflective material.

8. The optically transparent plate with the light emitting function according to claim 7, wherein the notch is provided to surround the LED die, and the reflective layer is placed, covering at least a part of a region surrounded by the notch.

9. The optically transparent plate with the light emitting function according to claim 7, wherein the reflective material is a conductive material obtained by sintering conductive particles.

10. The optically transparent plate with the light emitting function according to claim 9, wherein the reflective material is the same as the conductive material obtained by sintering the conductive particles that constitutes said at least a part of the wiring patterns.

11. The optically transparent plate with the light emitting function according to claim 7, wherein the notch is provided to surround the LED die, and to be inclined with respect to the upper surface of the optically transparent substrate.

12. The optically transparent plate with the light emitting function according to claim 7, wherein the notch is provided halfway through the thickness direction of the optically transparent substrate.

13. The optically transparent plate with the light emitting function according to claim 7, wherein:
the upper surface of the optically transparent substrate is covered with an optically transparent film in a manner that the LED die is embedded therein, and
the optically transparent film is provided with a second notch in the thickness direction thereof, in the vicinity of the LED die, and the second notch is filled with a reflective material.

14. The optically transparent plate with the light emitting function according to claim 1, wherein two or more LED dies are mounted, and the two or more LED dies include two or more types of LED dies that emit light with different wavelengths.

15. The optically transparent plate with the light emitting function according to claim 1, wherein the LED die is bonded to the wiring patterns via electromagnetic sintering.

16. The optically transparent plate with the light emitting function according to claim 1, wherein the ratio of a thickness to a width of the wiring patterns is 1/100 or higher.

17. The optically transparent plate with the light emitting function according to claim 1, wherein the wiring patterns are directly adhered to the optically transparent substrate.

18. The optically transparent plate with the light emitting function according to claim 1, wherein two or more LED dies are mounted on the upper surface of the optically transparent substrate.

19. The optically transparent plate with the light emitting function according to claim 18, wherein:
a second LED die is mounted on the lower surface of the optically transparent substrate,
the second LED die is directly connected to a part of the reflective layer, and
the second LED die is arranged at a position that allows light partially emitted from a part of the second LED, the part being unconnected with the reflective layer, to pass through the substrate and to be emitted from the upper surface thereof.

20. An optically transparent plate with a light emitting function comprising: an optically transparent substrate; a plurality of wiring patterns; an LED die mounted on the optically transparent substrate; and a reflective layer; wherein: the optically transparent substrate has a shape of one flat plate formed of an optically transparent material, and has an upper surface and a lower surface; the LED die mounted on the optically transparent substrate has a bottom surface facing the upper surface of the optically transparent substrate, a top surface that is opposite the bottom surface, and side surfaces arranged between the bottom surface and the top surface, and the LED die emits light from an entire surface of the bottom surface, the upper surface, and the side surfaces; the plurality of wiring patterns are placed at least on the upper surface of the optically transparent substrate, and the LED die is electrically connected to the plurality of wiring patterns placed on the upper surface of the optically transparent substrate; a region with no wiring patterns is provided between the plurality of the wiring patterns electrically connected to the LED die, on the upper surface of the optically transparent substrate; the LED die is mounted on adjacent wiring patterns among the plurality of wiring patterns with the region interposed therebetween such that the LED die is placed on the adjacent wiring patterns across the region, and directly bonded to the wiring patterns; the reflective layer is formed on the lower surface of the optically transparent substrate, and a position of the reflective layer on the lower surface faces the LED die, including the region between the wiring patterns on the upper surface; both at least a part of the wiring patterns and at least a part of the reflective layer comprise a conductive material obtained by sintering conductive particles; the LED die, the wiring patterns, and the reflective layer are arranged so that external light penetrates areas between the LED die, the wiring patterns, and the reflective layer, on the optically transparent substrate when the LED die is not illuminated; the conductive particles include metal and form the reflective layer reflecting light; two or more LED dies are mounted on the upper surface of the optically transparent substrate; a second LED die is mounted on the lower surface of the optically transparent substrate; the second LED die is directly connected to a part of the reflective layer; and the second LED die is arranged at a position that allows light partially emitted from a part of the second LED, the part being unconnected with the reflective layer, to pass through the substrate and to be emitted from the upper surface thereof.

* * * * *